United States Patent
Kalitsov et al.

(10) Patent No.: US 10,700,093 B1
(45) Date of Patent: Jun. 30, 2020

(54) FERROELECTRIC MEMORY DEVICES EMPLOYING CONDUCTIVITY MODULATION OF A THIN SEMICONDUCTOR MATERIAL OR A TWO-DIMENSIONAL CHARGE CARRIER GAS AND METHODS OF OPERATING THE SAME

(71) Applicant: SANDISK TECHNOLOGIES LLC, Addison, TX (US)

(72) Inventors: Alan Kalitsov, San Jose, CA (US); Derek Stewart, Livermore, CA (US); Daniel Bedau, San Jose, CA (US); Gerardo Bertero, Redwood City, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/227,889

(22) Filed: Dec. 20, 2018

(51) Int. Cl.
*G11C 11/22* (2006.01)
*H01L 27/11585* (2017.01)
*H01L 29/417* (2006.01)
*H01L 29/51* (2006.01)
(Continued)

(52) U.S. Cl.
CPC .... *H01L 27/11585* (2013.01); *G11C 11/2273* (2013.01); *G11C 11/2275* (2013.01); *H01L 29/40111* (2019.08); *H01L 29/41725* (2013.01); *H01L 29/516* (2013.01); *H01L 29/778* (2013.01)

(58) Field of Classification Search
CPC ......... H01L 27/11585; H01L 29/40111; H01L 29/41725; H01L 29/516; H01L 29/778; G11C 11/2273; G11C 11/2275
See application file for complete search history.

(56) References Cited

U.S. PATENT DOCUMENTS

| 5,198,994 | A  | 3/1993 | Natori |
| 9,721,963 | B1 | 8/2017 | Rabkin et al. |
| 9,941,299 | B1 | 4/2018 | Chen et al. |

(Continued)

FOREIGN PATENT DOCUMENTS

| EP | 3128534 A2 | 2/2017 |
| JP | 2006210525 A | 8/2006 |

OTHER PUBLICATIONS

Zheng et al., "Gate-controlled Non-Volatile Graphene-ferroelectric Memory," Appl. Phys. Lett. 94, 163505 (2009).

(Continued)

*Primary Examiner* — Gene N Auduong
(74) *Attorney, Agent, or Firm* — The Marbury Law Group, PLLC

(57) ABSTRACT

A ferroelectric memory device contains a two-dimensional semiconductor material layer having a band gap of at least 1.1 eV and at least one of a thickness of 1 to 5 monolayers of atoms of the semiconductor material or includes a two-dimensional charge carrier gas layer, a source contact contacting a first portion of the two-dimensional semiconductor material layer, a drain contact contacting a second portion of the two-dimensional semiconductor material layer, a ferroelectric memory element located between the source and drain contacts and adjacent to a first surface of the two-dimensional semiconductor material layer, and a conductive gate electrode located adjacent to the ferroelectric memory element.

20 Claims, 18 Drawing Sheets

(51) Int. Cl.
*H01L 29/778* (2006.01)
*H01L 21/28* (2006.01)

(56) References Cited

U.S. PATENT DOCUMENTS

| | | | |
|---|---|---|---|
| 10,403,753 B2 * | 9/2019 | Jonker | G11C 11/02 |
| 2001/0048622 A1 | 12/2001 | Kwon et al. | |
| 2003/0053350 A1 | 3/2003 | Krieger et al. | |
| 2003/0155602 A1 | 8/2003 | Krieger et al. | |
| 2003/0178667 A1 | 9/2003 | Krieger et al. | |
| 2003/0179633 A1 | 9/2003 | Krieger et al. | |
| 2004/0026729 A9 | 2/2004 | Krieger et al. | |
| 2004/0159835 A1 | 8/2004 | Krieger et al. | |
| 2005/0151177 A1 | 7/2005 | Miyazawa et al. | |
| 2007/0020803 A1 | 1/2007 | Saigoh et al. | |
| 2009/0026513 A1 * | 1/2009 | Johansson | C08F 214/22 |
| | | | 257/295 |
| 2010/0144064 A1 | 6/2010 | Saigoh et al. | |
| 2012/0104325 A1 | 5/2012 | Talapin et al. | |
| 2014/0098458 A1 | 4/2014 | Almadhoun et al. | |
| 2015/0372225 A1 | 12/2015 | Gaidis et al. | |
| 2016/0172365 A1 | 6/2016 | McKinnon et al. | |
| 2016/0276579 A1 | 9/2016 | Gaidis et al. | |
| 2016/0308107 A1 | 10/2016 | Talapin et al. | |
| 2017/0114241 A1 | 4/2017 | Almadhoun et al. | |
| 2017/0316713 A1 | 11/2017 | Hyman | |
| 2018/0158934 A1 * | 6/2018 | Jonker | H01L 21/187 |
| 2018/0158955 A1 * | 6/2018 | Jonker | H01L 29/78391 |

OTHER PUBLICATIONS

Song et al., "Robust bi-stable Memory Operation in Single-layer Graphene Ferroelectric Memory," Appl. Phys. Lett. 99, 042109 (2011).
Zheng et al., "Graphene Field Effect Transistors with Ferroelectric Gating," Phys. Rev. Lett. 105, 166602 (2010).
Cadore et al., "Thermo Activated Hysteresis on High Quality Graphene/h-BN Devices," Nano Lett. 14, 5437 (2014).
Ahn et al., "Energy-Efficient Phase-Change Memory with Graphene as a Thermal Barrier," Nano Letters, 15, 6809 (2015).
Huang et al., "Graphene/Si CMOS Hybrid Hall Integrated Circuits," Science Reports, 4, 5548 (2014).
Ismach et al., "Direct Chemical Vapor Deposition of Graphene on Dielectric Surfaces," Nano Letters, 10, 1542 (2010).
Miro et al., "An Atlas of Two-Dimensional Materials," Chem. Soc. Rev., 2014,43, 6537-6554.
Notification of Transmittal of the International Search Report and Written Opinion of the International Search Authority or International Patent Application No. PCT/US2019/046717, dated Nov. 17, 2019, 11 pages.

* cited by examiner

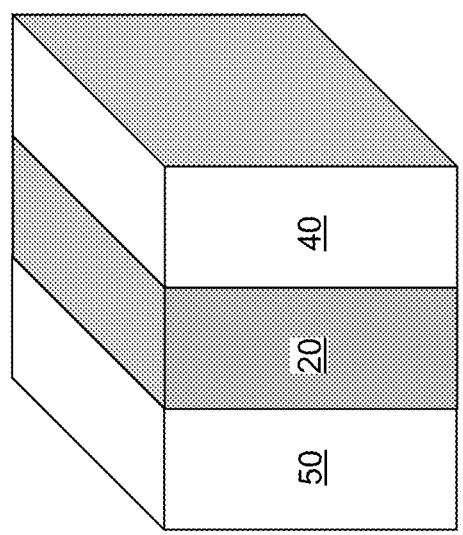

FERROELECTRIC MEMORY DEVICES EMPLOYING CONDUCTIVITY MODULATION OF A THIN SEMICONDUCTOR MATERIAL OR A TWO-DIMENSIONAL CHARGE CARRIER GAS AND METHODS OF OPERATING THE SAME

FIELD

The present disclosure relates generally to the field of semiconductor devices and specifically to ferroelectric memory devices employing conductivity modulation of a thin semiconductor material layer or a two-dimensional charge carrier gas, methods of operating the same, and methods of making the same.

BACKGROUND

A ferroelectric memory device is a memory device containing a ferroelectric material to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material in a field effect transistor ferroelectric memory device.

SUMMARY

According to an aspect of the present disclosure, a ferroelectric memory device contains a two-dimensional semiconductor material layer having a band gap of at least 1.1 eV and at least one of a thickness of 1 to 5 monolayers of atoms of the semiconductor material or includes a two-dimensional charge carrier gas layer; a source contact contacting a first portion of the two-dimensional semiconductor material layer; a drain contact contacting a second portion of the two-dimensional semiconductor material layer; a ferroelectric memory element located between the source and drain contacts and adjacent to a first surface of the two-dimensional semiconductor material layer; and a conductive gate electrode located adjacent to the ferroelectric memory element.

According to another aspect of the present disclosure, a method of operating the ferroelectric memory device is provided. A polarization direction of the ferroelectric memory element can be programmed by applying a positive bias voltage or a negative bias voltage to the conductive gate electrode with respective to the two-dimensional semiconductor material layer. The polarization direction of the ferroelectric memory element can be sensed by measuring the magnitude of electrical current between the source contact and the drain contact under a read voltage between the source contact and the drain contact.

According to yet another aspect of the present disclosure, a method of manufacturing the ferroelectric memory device comprises forming the two-dimensional semiconductor material layer; forming the ferroelectric memory element directly on a first surface of the two-dimensional semiconductor material layer, forming the conductive gate electrode on the ferroelectric memory element, forming the source contact on the first end portion of the two-dimensional semiconductor material layer, and forming the drain contact on the second end portion of the two-dimensional semiconductor material layer.

BRIEF DESCRIPTION OF THE DRAWINGS

FIG. 1 is a perspective view of a metal-ferroelectric-semiconductor structure.

DETAILED DESCRIPTION

Figures 2A, 2B:
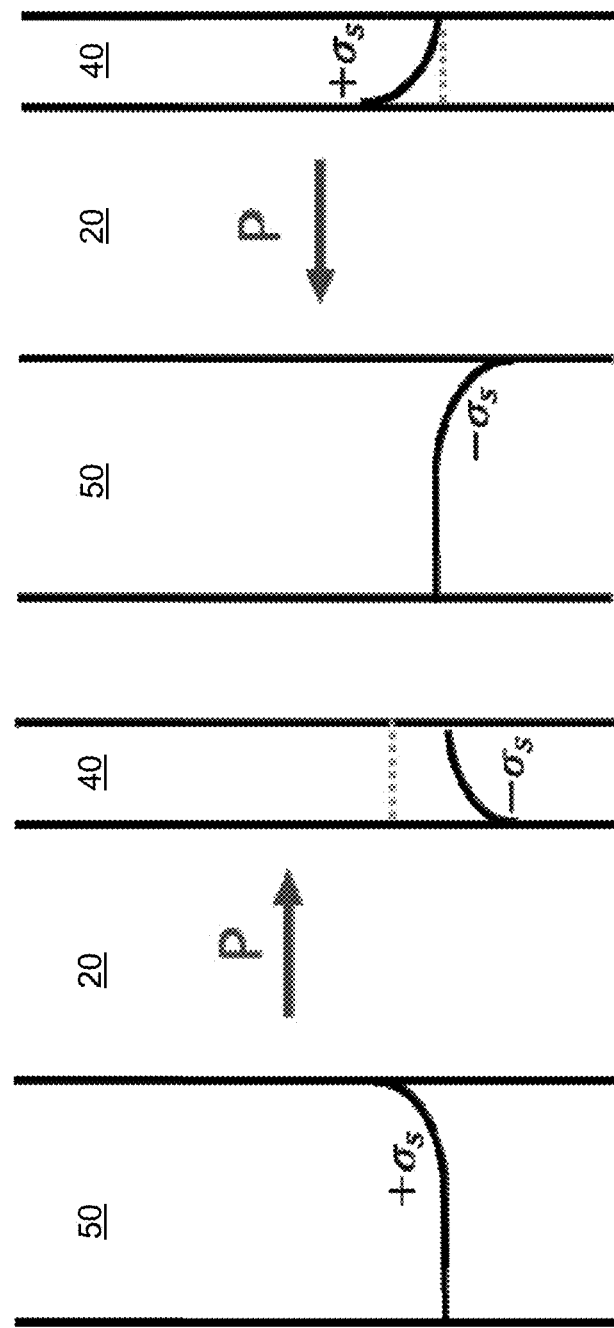
FIG. 2A is a potential diagram for a first polarization state of the metal-ferroelectric-semiconductor structure of FIG. 1.
FIG. 2B is a potential diagram for a second polarization state of the metal-ferroelectric-semiconductor structure of FIG. 1.

Embodiments of the present disclosure are directed to ferroelectric memory devices employing conductivity modulation of a two-dimensional semiconductor material layer comprising a thickness of 1 to 5 monolayers of atoms of the semiconductor material and/or a two-dimensional charge carrier gas channel layer, such as a two-dimensional electron gas ("2DEG") channel layer, methods of operating the same, and methods of making the same, the various aspects of which are described below. The ferroelectric state of the ferroelectric memory element induces changes in the conductance in the semiconductor material or in the two-dimensional charge carrier gas layer by orders of magnitude.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/m to $1.0 \times 10^{5}$ S/m. As used herein, a "semiconductor material" refers to a material having electrical conductivity in the range from $1.0 \times 10^{-6}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-6}$ S/m. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "ferroelectric material" refers to any material that exhibits spontaneous electric polarization that can be reversed by the application of an external electric field.

Referring to FIG. 1, a metal-ferroelectric-semiconductor structure according to an embodiment of the present disclosure is illustrated. The metal-ferroelectric-semiconductor structure includes metal portion that comprises as a gate electrode 50, a ferroelectric material portion that comprises a gate dielectric/ferroelectric memory element 20, and a semiconductor portion that comprises a semiconductor channel 40 in a ferroelectric memory device to be described below.

Referring to FIGS. 2A and 2B, potential diagrams are illustrated for polarization states of the metal-ferroelectric-semiconductor structure of FIG. 1. FIG. 2A illustrates a first polarization state of the metal-ferroelectric-semiconductor structure of FIG. 1 in which the ferroelectric polarization vector P points in the positive polarization direction from the metal portion (such as a gate electrode 50) to the semiconductor portion (such as a semiconductor channel 40). In this case, positive ferroelectric charges are present on the side of the ferroelectric material portion (such as the gate dielectric 20) at the interface with the semiconductor portion (such as the semiconductor channel 40), and negative ferroelectric charges are present on the side of the ferroelectric material portion (such as the gate dielectric 20) at the interface with the metal portion (such as the gate electrode 50). The ferroelectric charges induce screening charges within the metal portion and within the semiconductor portion. The screening charges are mobile electrical charges (such as electrons or holes) that reduce the electric fields caused by the ferroelectric charges within the ferroelectric material portion. Positive screening charges accumulate within the metal portion (such as a gate electrode 50), and negative screening charges accumulate within the semiconductor portion (such as a semiconductor channel 40).

FIG. 2B illustrates a second polarization state of the metal-ferroelectric-semiconductor structure of FIG. 1 in which the ferroelectric polarization vector P points in the negative polarization direction from the semiconductor portion (such as a semiconductor channel 40) to the metal portion (such as a gate electrode 50). In this case, negative ferroelectric charges are present on the side of the ferroelectric material portion (such as the gate dielectric 20) at the interface with the semiconductor portion (such as the semiconductor channel 40), and positive ferroelectric charges are present on the side of the ferroelectric material portion (such as the gate dielectric 20) at the interface with the metal portion (such as the gate electrode 50). The ferroelectric charges induce screening charges within the metal portion and within the semiconductor portion. Negative screening charges accumulate within the metal portion (such as a gate electrode 50), and positive screening charges accumulate within the semiconductor portion (such as a semiconductor channel 40).

The screening potential at the interface between the ferroelectric material portion and the metal portion can be controlled by switching the polarization direction of the ferroelectric material portion. The electrostatic potential $V_c(x)$ as a function of a distance x from the interface between the metal portion and the ferroelectric material portion decays with a characteristic decay distance, which is referred to as the Thomas-Fermi screening length. If the x-axis is selected such that the x-coordinate is positive within the ferroelectric material portion having a thickness of d and with the semiconductor material portion, the electrostatic potential $V_c(x)$ within the metal portion and the semiconductor material portion is governed by the equation, $$\frac{d^2 V_c(x)}{dx^2} = \frac{V_c(x)}{\lambda^2},$$

in which λ is the Thomas-Fermi screening length within the respective material portion.

In case the metal portion (such as the gate electrode 50) is much thicker than the screening length $\lambda_l$ for the metal portion, and if the semiconductor material portion (such as the semiconductor channel 40) is thinner, the solution to the electrostatic potential $V_c(x)$ for the semiconductor material portion (i.e., x>d) is given by:

$$V_c(x) = \frac{dP\lambda'_l}{\varepsilon_0(\varepsilon(\lambda_r + \lambda'_l) + d)} e^{-|x-d|/\lambda'_l},$$

in which d is the thickness of the ferroelectric material portion, P is the ferroelectric polarization of the ferroelectric material portion, $\varepsilon_0$ is the permittivity of vacuum, ε is the relative permittivity of the ferroelectric material portion (i.e., the ratio of the permittivity of the ferroelectric material portion to the permittivity of vacuum), $\lambda_l$ is the Thomas-Fermi screening length for the metal portion, $\lambda_r$ is the Thomas-Fermi screening length for the semiconductor material portion, l is the thickness of the semiconductor material portion, and $\lambda'_l$ is given by:

$$\lambda'_l = \frac{\lambda_l}{1 - e^{-l/\lambda_l}}.$$

According to an aspect of the present disclosure, the electrostatic potential in the interfacial region of the semiconductor material portion in proximity to the ferroelectric material portion can be controlled by reversing the ferroelectric polarization within the ferroelectric material portion. For the positive polarization direction illustrated in FIG. 2A, the screening charges bring the Fermi level into the conduction band of the semiconductor material of the semiconductor material portion. For the negative polarization direction illustrated in FIG. 2B, the screening charges move the Fermi level towards the band gap. Thus, the Fermi level moves between a position in the semiconductor band gap and a position in one of the bands (e.g., conduction or valence band) by reversing the ferroelectric polarization direction, which leads to a large difference between the resistive (e.g., resistivity or resistance) states of the device.

According to an aspect of the present disclosure, the semiconductor material portion includes a two-dimensional semiconductor material providing high conductivity within a two-dimensional plane that is parallel to the interface between the semiconductor material portion and the ferroelectric material portion. As used herein, a two-dimensional semiconductor material refers to a semiconductor material having a thickness of 1 to 5 monolayers, such as 2 to 3 monolayers of the atoms of the semiconductor material and/or which contains a two-dimensional charge carrier gas, such as a two-dimensional electron gas. In one embodiment, the two-dimensional semiconductor material has a lateral extent along one direction that induces quantum mechanical modification of the band structure. In one embodiment, a two-dimensional semiconductor material can have a lateral direction less than 10 nm along one direction, which is herein referred to as the thickness direction of the two-dimensional semiconductor material.

According to an aspect of the present disclosure, the semiconductor material portion includes a two-dimensional semiconductor material layer having a thickness of 1 to 5 monolayer and having a band gap of at least 1 eV, such as at least 1.15 eV, for example 1.15 eV to 5.65 eV. Alternatively, it may include a layer of a two-dimensional charge carrier gas (such as a two-dimensional electron gas) and a band gap of at least 1 eV, such as at least 1.15 eV, for example 1.15 eV to 5.65 eV. As used herein, a two-dimensional charge carrier gas refers to a collection of charge carriers in quantum confinement that provides enhanced conductivity along directions that are perpendicular to the direction of the quantum confinement. For example, a two-dimensional electron gas is a two-dimensional charge carrier gas. In one embodiment, the semiconductor material portion includes a two-dimensional semiconductor material selected from hexagonal boron nitride having a band gap of 5.62 eV, fluorinated graphene having a band gap of 2.93 eV, molybdenum disulfide having a band gap of 2.24 eV, and germanane having a band gap of 1.16 eV. The list of possible candidates of two-dimensional semiconductor materials is not limited with aforementioned materials.

Figure 3:
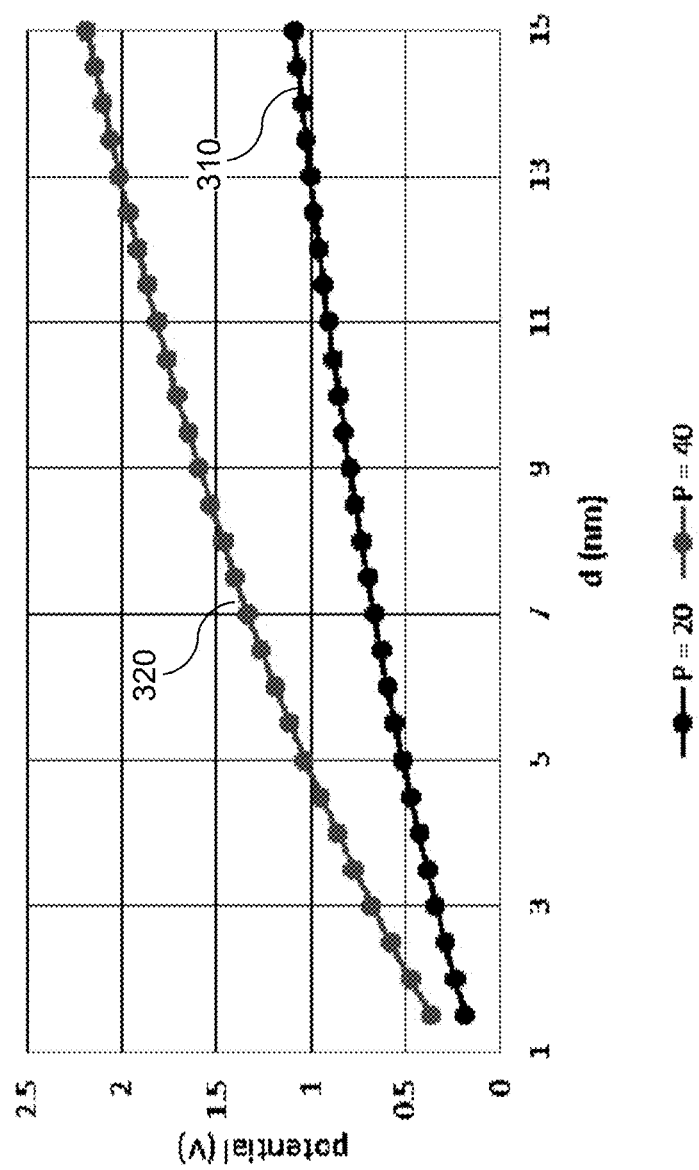
FIG. 3 is a plot of the electrostatic potential at the interface between the ferroelectric material portion and the metal portion as a function of the ferroelectric thickness for the metal-ferroelectric-semiconductor structure for two selected ferroelectric polarization densities.

FIG. 3 is a plot of the electrostatic potential $V_c(0)$ at the interface between the ferroelectric material portion and the metal portion as a function of the ferroelectric thickness d for the metal-ferroelectric-semiconductor structure of FIG. 1 calculated within the Thomas-Fermi model. According to this model the electrostatic potential $V_c(0)$ at the interface between the ferroelectric material portion and the semiconductor portion is given by:

$$V_c(0) = -\frac{dP\lambda'_l}{\varepsilon_0(\varepsilon(\lambda_r + \lambda'_l) + d)}.$$

A first curve 310 corresponds to the case in which the ferroelectric polarization is 20 μC/cm$^2$, the relative permittivity of the ferroelectric material portion is 90, the Thomas-Fermi screening length for the metal portion is 0.2 nm, and the Thomas-Fermi screening length for the semiconductor material portion is 0.2 nm. A second curve 320 corresponds to the case in which the ferroelectric polarization is 40 μC/cm$^2$, the relative permittivity of the ferroelectric material portion is 90, the Thomas-Fermi screening length for the metal portion is 0.2 nm, and the Thomas-Fermi screening length for the semiconductor material portion is 0.2 nm. Electrostatic potential greater than 1.0 V, and/or greater than 1.5 V, and/or greater than 2.0 V can be generated at the interface between the ferroelectric material portion and the metal portion through ferroelectric polarization effect.

Figure 4:
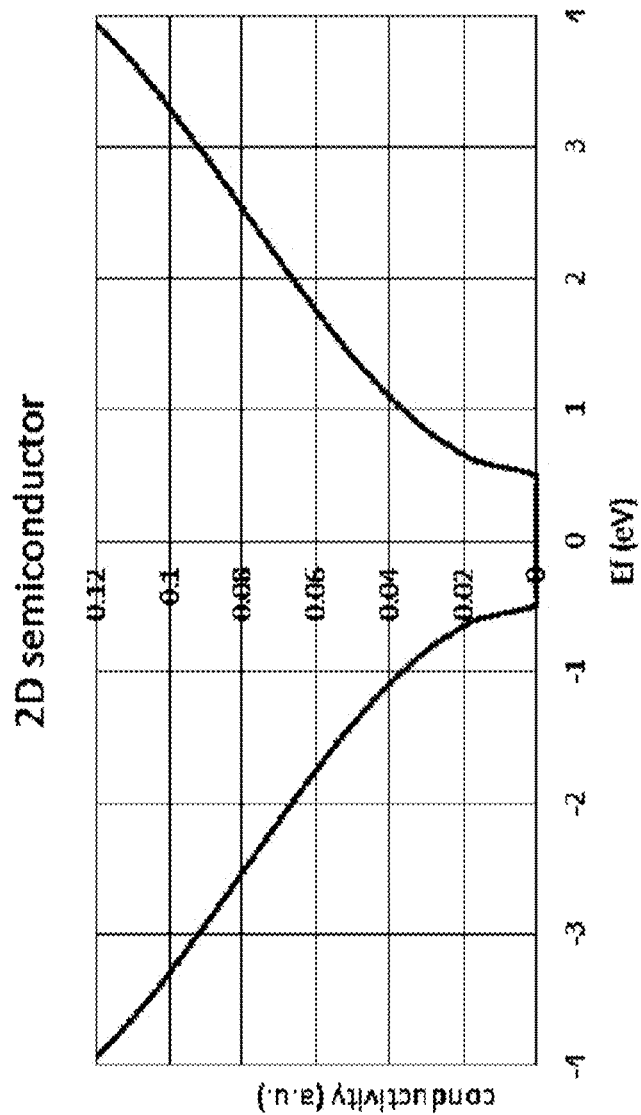
FIG. 4 is a graph of conductivity as a function of the Fermi level for a two-dimensional generic semiconductor material.

FIG. 4 a graph of electrical conductivity as a function of the Fermi level for a hypothetical two-dimensional semiconductor material (e.g., for a monolayer of the semiconductor material). For the purpose of the calculation in FIG. 4, a simple model of a two-dimensional semiconductor material based on the two-band tight binding Hamiltonian was employed. When such a two-dimensional semiconductor material is employed for the semiconductor material portion of the device of FIG. 1, it is possible to switch the state of the two-dimensional semiconductor material between a conducting state and an insulating state by reversing the direction of the ferroelectric polarization as illustrated in FIGS. 2A and 2B. In other words, the shift in the Fermi level in the device of FIG. 1 can be sufficient to provide two distinct resistive states, such as a higher resistive state and a lower resistive state, which may be, for example, a conducting state and an insulating state.

According to an embodiment of the present disclosure, the functional dependence of the electrical conductivity on the Fermi level illustrated in FIG. 4 can be physically manifested in any suitable two-dimensional semiconductor material, such as hexagonal boron nitride, fluorinated graphene, molybdenum disulfide, germanane, etc.

Table 1 below shows calculated values for the band gap and for conduction band on-site energy for the various materials that can be employed in the ferroelectric memory device of the present disclosure. The band gap values were obtained from first principles electronic structure calculations based on the hybrid functional and the tight binding onsite energies were fitted to reproduce calculated band structures.

TABLE 1

Band gap and the conduction band onsite energy for two-dimensional semiconductor materials

| –Two-dimensional semiconductor material | Band gap (eV) | Conduction band onsite energy (eV) |
|---|---|---|
| Hexagonal BN | 5.62 | 6.81 |
| MoS$_2$ | 2.24 | 5.12 |
| Fluorinated graphene | 2.93 | 5.465 |
| Germanane | 1.16 | 4.58 |

A list of other suitable highly stable two-dimensional semiconductor materials and their band gaps calculated within DFT taken from the following database (https://cmrdblysik.dtu.dk/c2db/?x=29127&limit=200) is shown in Table 2. DFT is known to underestimates the band gap values, therefore the real band gaps are expected to be larger.

TABLE 2

Band gap for additional two-dimensional semiconductor materials

| Two-dimensional semiconductor material | Band gap (eV) |
|---|---|
| AU$_2$S$_2$ | 1.218 |
| GeS | 2.447 |
| GeSe | 2.219 |
| GeTe | 1.468 |
| SnS | 2.288 |
| SnSe | 2.152 |
| AsBrS | 1.387 |
| AsBrSe | 1.228 |
| AsClSe | 1.374 |
| AsISe | 1.152 |
| AsIS | 1.338 |
| AsBrTe | 1.238 |
| BrSSb | 1.220 |
| ISSb | 1.223 |
| ClSbTe | 1.258 |
| VBrCl | 1.290 |
| VBrI | 1.189 |
| Cu$_2$Br$_2$ | 1.496 |
| Rb$_2$F$_2$ | 4.557 |
| Cs$_2$F$_2$ | 4.151 |
| Al$_2$S$_2$ | 2.142 |
| Al$_2$Se$_2$ | 2.138 |
| Ga$_2$S$_2$ | 2.180 |
| In$_2$S$_2$ | 1.604 |
| MnCl$_2$ | 2.025 |
| MnBr$_2$ | 1.775 |
| ZnF$_2$ | 4.425 |
| ZnCl$_2$ | 4.213 |
| ZnI$_2$ | 2.432 |
| GeS$_2$ | 1.344 |
| GeO$_2$ | 3.006 |
| MnI$_2$ | 1.223 |
| ZnBr$_2$ | 3.272 |
| SnS$_2$ | 1.438 |
| BaBr$_2$ | 4.902 |
| BaCl$_2$ | 5.618 |
| CaBr$_2$ | 4.863 |
| CaI$_2$ | 3.537 |
| CdI$_2$ | 2.136 |
| GeI$_2$ | 1.954 |
| HgBr$_2$ | 1.982 |
| MgBrI$_2$ | 4.588 |
| MgI$_2$ | 3.273 |
| MnBr$_2$ | 1.477 |
| MnCl$_2$ | 1.797 |
| NiCl$_2$ | 1.217 |
| PbBr$_2$ | 2.004 |
| SrBr$_2$ | 4.929 |
| SrI$_2$ | 3.984 |
| VBr$_2$ | 1.252 |
| VCl$_2$ | 1.354 |
| VI$_2$ | 1.206 |
| ZnBr$_2$ | 3.353 |
| ZnCl$_2$ | 4.453 |
| ZnI$_2$ | 1.749 |
| CaBr$_2$ | 4.128 |
| CaCl$_2$ | 4.771 |
| CaI$_2$ | 2.946 |
| MgCl$_2$ | 4.762 |
| SrCl$_2$ | 4.944 |
| Co2Cl$_6$ | 1.130 |
| Cr$_2$Br$_6$ | 1.644 |
| Cr$_2$Cl$_6$ | 1.735 |
| Mo$_2$Br$_6$ | 1.561 |
| Rh$_2$Br$_6$ | 1.344 |
| Rh$_2$Cl$_6$ | 1.590 |
| Cr$_2$CF$_2$ | 1.166 |
| Y$_2$CF$_2$ | 1.117 |
| MoSeTe | 1.136 |
| MoSSe | 1.453 |

TABLE 2-continued

Band gap for additional two-dimensional semiconductor materials

| Two-dimensional semiconductor material | Band gap (eV) |
|---|---|
| WSSe | 1.401 |
| WSTe | 1.142 |
| BiBrS | 1.250 |
| BiClS | 1.497 |
| BiClSe | 1.290 |
| BrSSb | 1.427 |
| BrSbTe | 1.318 |
| BrSbSe | 1.462 |
| AsBrS | 1.417 |
| $Pd_2S_4$ | 1.120 |
| $Pd_2Se_4$ | 1.313 |
| $Pd_2Te_4$ | 1.212 |
| $Pt_2S_4$ | 1.802 |
| $Pt_2Se_4$ | 1.441 |
| $Pt_2Te_4$ | 1.309 |
| $Re_4S_8$ | 1.276 |
| $Re_4Se_8$ | 1.110 |
| $GeO_2$ | 3.641 |
| $HfS_2$ | 1.221 |
| $MoSe_2$ | 1.321 |
| $NiO_2$ | 1.281 |
| $PbO_2$ | 1.346 |
| $PbS_2$ | 1.390 |
| $PdO_2$ | 1.379 |
| $PdS_2$ | 1.171 |
| $PtO_2$ | 1.674 |
| $PtS_2$ | 1.688 |
| $PtSe_2$ | 1.167 |
| $SnO_2$ | 2.683 |
| $SnS_2$ | 1.587 |
| $WO_2$ | 1.340 |
| $WS_2$ | 1.534 |
| $WSe_2$ | 1.238 |
| $ZrS_2$ | 1.159 |
| $CrW_3S_8$ | 1.126 |
| $Mo_2W_2S_8$ | 1.532 |
| $Mo_3WS_8$ | 1.559 |
| $MoW_3S_8$ | 1.258 |
| $Al_2Br_2O_2$ | 4.142 |
| $Al_2Br_2S_2$ | 2.263 |
| $Al_2Br_2Se_2$ | 1.535 |
| $Al_2Cl_2S_2$ | 2.334 |
| $Al_2I_2S_2$ | 1.615 |
| $Al_2I_2Se_2$ | 1.493 |
| $Cr_2Cl_2O_2$ | 1.190 |
| $Ga_2Br_2O_2$ | 2.515 |
| $Hf_2Br_2N_2$ | 2.064 |
| $Hf_2Cl_2N_2$ | 2.101 |
| $Sc_2Br_2S_2$ | 2.130 |
| $Sc_2Br_2Se_2$ | 1.510 |
| $Sc_2Cl_2Se_2$ | 1.409 |
| $Sc_2I_2S_2$ | 1.662 |
| $Sc_2I_2Se_2$ | 1.393 |
| $Al_2S_2$ | 2.085 |
| $Al_2Se_2$ | 1.997 |
| $Al_2Te_2$ | 1.748 |
| $Ga_2O_2$ | 1.556 |
| $Ga_2S_2$ | 2.321 |
| $Ga_2Se_2$ | 1.765 |
| $In_2S_2$ | 1.675 |
| $Hf_2O_6$ | 3.470 |
| $Ti_2O_6$ | 2.461 |
| $Zr_2O_6$ | 3.586 |
| $Mn_2Br_4$ | 1.818 |
| $Mn_2Cl_4$ | 2.033 |
| $Mn_2I_4$ | 1.349 |
| $Mn_2O_4$ | 1.287 |
| $Ti_2O_4$ | 2.855 |
| $V_2Br_4$ | 1.294 |
| $V_2Cl_4$ | 1.426 |
| $V_2I_4$ | 1.157 |
| $C_2H_2$ | 3.460 |
| $CH_2Si$ | 4.000 |

Figure 5:
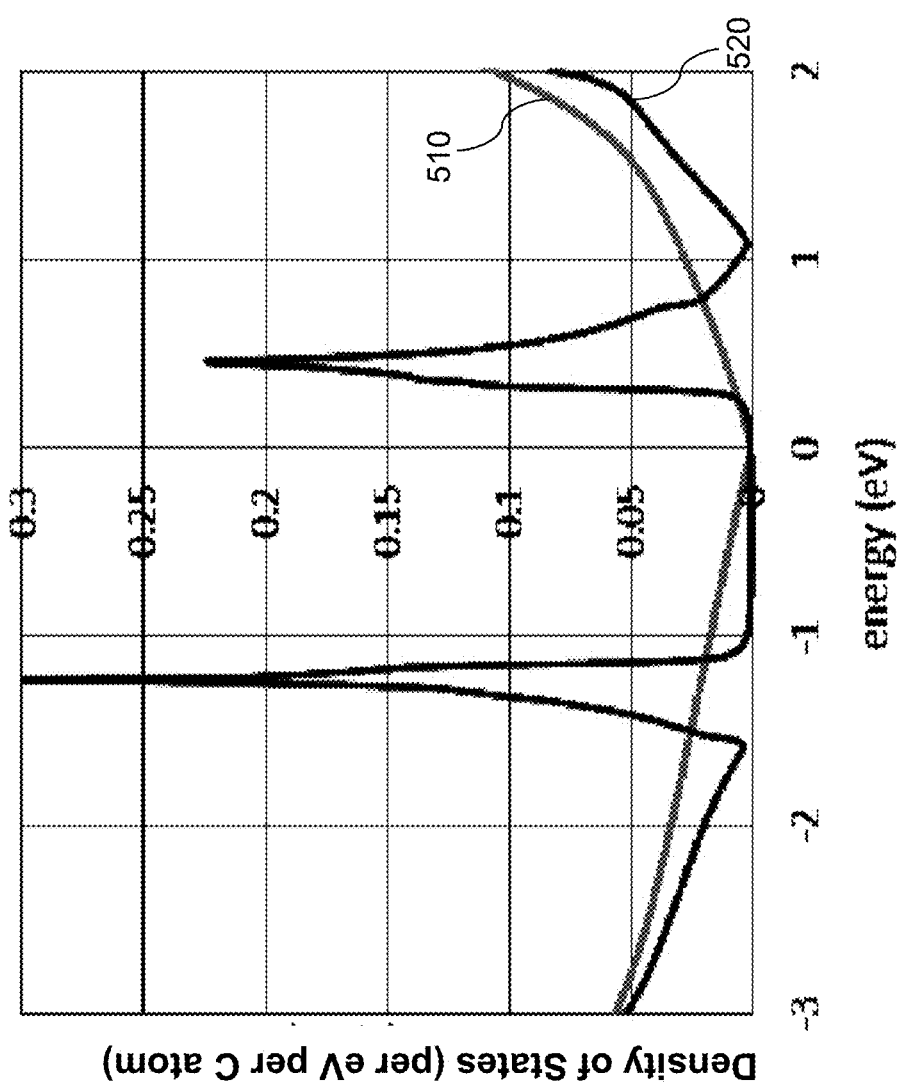
FIG. 5 is a graph of the density of states per eV per atom for pristine graphene and for fluorinated graphene calculated within the tight binding model.

Pristine graphene (i.e., graphene without defects or dopants) is an electrical conductor which lacks a band gap, while a fluorinated graphene is a semiconductor having a band gap. FIG. 5 is a graph of the density of states per eV per carbon atom for pristine graphene and for fluorinated graphene. The tight binding model was employed for the purpose of the calculation for the density of states per energy. Curve 510 represents the density of states per eV per carbon atom for pristine graphene. Curve 520 represents the density of states per eV per carbon atom for fluorinated graphene. Pristine graphene provides non-zero density of states at all energies other than zero, and thus, does not provide a voltage at which pristine graphene becomes insulating. Fluorinated graphene provides an energy band at which the density of states is zero, and thus, provides a voltage range at which fluorinated graphene functions as an insulating material.

Figure 6:
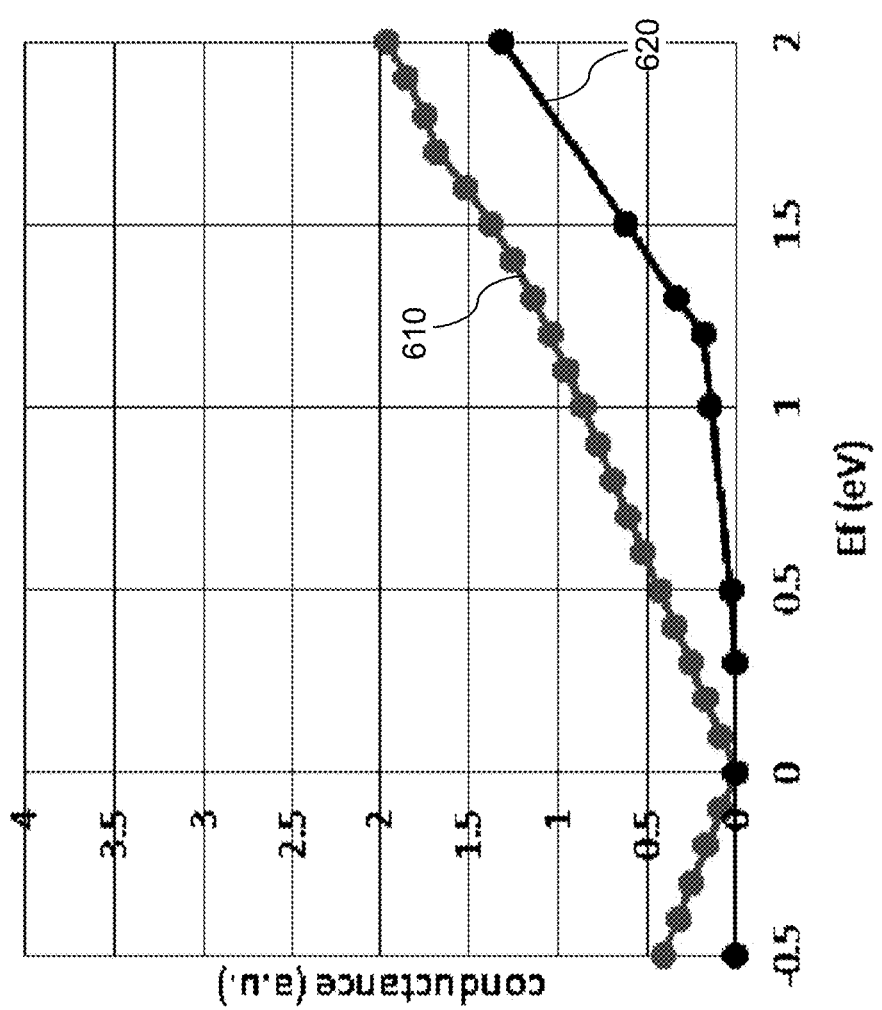
FIG. 6 is a graph of the conductance as a function of Fermi level for pristine graphene and for fluorinated graphene calculated within the tight binding model.

Referring to FIG. 6, the calculated conductance of pristine graphene and fluorinated graphene is plotted as a function of the Fermi energy. Curve 610 represents the conductance of pristine graphene, and curve 620 represents the conductance of fluorinated graphene. Fluorinated graphene provides an energy range in which conductance is negligible and the fluorinated graphene functions as an insulating material for Fermi level of 0.5 eV or less. In contrast, pristine graphene does not provide an energy range in which pristine graphene can function as an insulating material.

The atomic percentage of fluorine in the fluorinated graphene can be in a range from 0.1% to 60%, such as from 0.5% to 50%, including from 0.1% to 0%. Thus, fluorinated graphene can include but is not limited to graphene fluoride having a roughly 1:1 ratio of carbon to fluorine atoms. The location and the width of the energy band at which the density of states is zero in fluorinated graphene changes with the atomic concentration of the fluorine atoms within fluorinated graphene. Thus, switching between an insulating state and a conducting state within the device of FIG. 1 is possible for fluorinated graphene semiconductor material which functions as the semiconductor material portion. Other semiconductor materials which have a sufficient band gap, such as molybdenum disulfide, hexagonal boron nitride, or germanane may be employed in lieu of fluorinated graphene in the device of FIG. 1.

Figure 7:
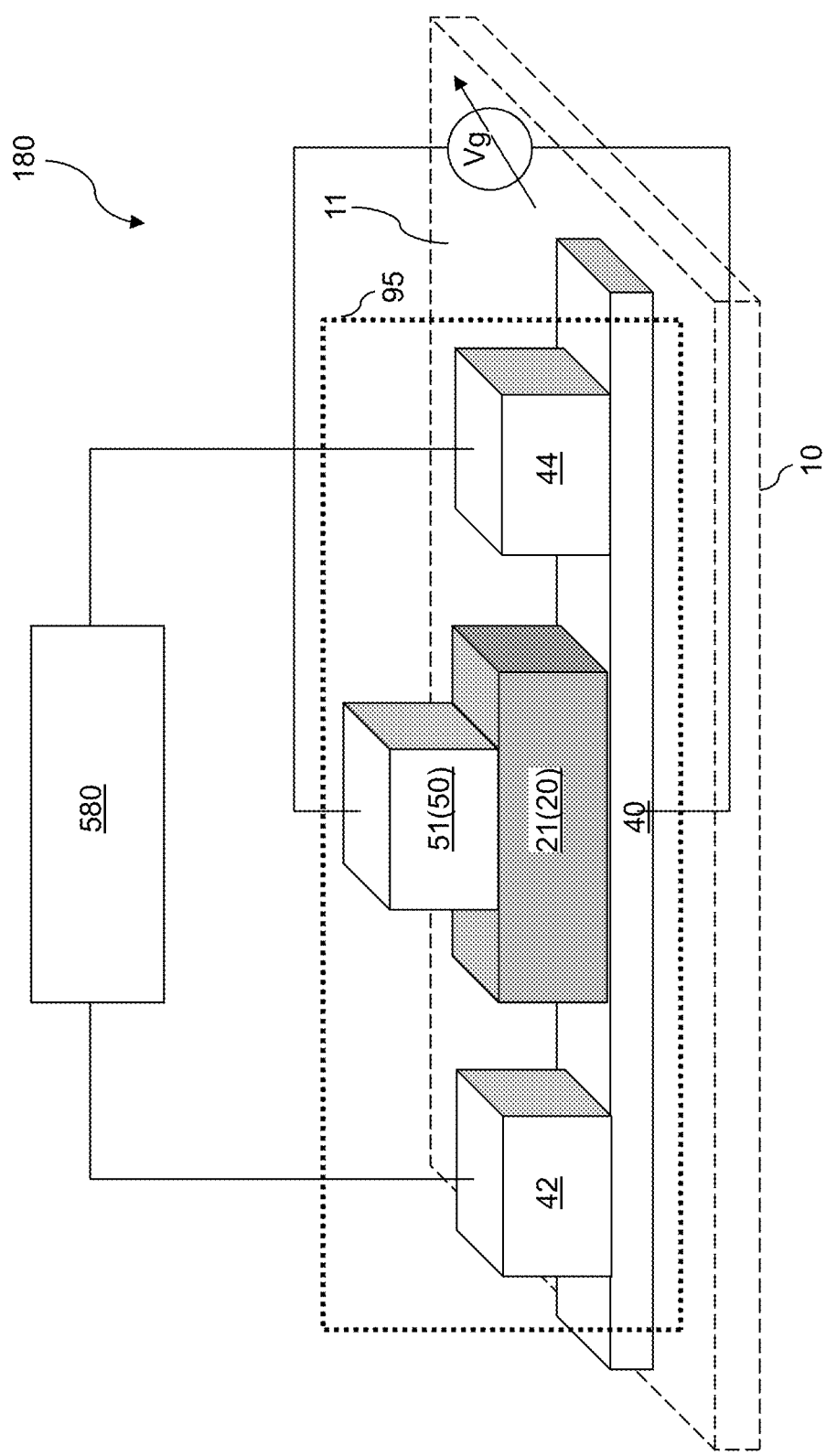
FIG. 7 is a first exemplary ferroelectric memory device according to a first embodiment of the present disclosure.

FIG. 7 illustrates a first exemplary ferroelectric memory device 180 according to a first embodiment of the present disclosure. The first ferroelectric memory device 180 includes a transistor 95 containing semiconductor channel 40. The semiconductor channel 40 can be configured to provide a two-dimensional charge carrier gas layer, such as a 2DEG layer or a semiconductor material selected from fluorinated graphene, hexagonal boron nitride, molybdenum disulfide, germanane, or a similar two-dimensional material with a sufficient band gap. The semiconductor channel 40 may consist of only the two-dimensional charge carrier gas layer or it may include additional semiconductor material in addition to the two-dimensional charge carrier gas layer. The two-dimensional charge carrier gas layer can be located within a two-dimensional Euclidean plane. In one embodiment, the semiconductor channel 40 can have a thickness in a range from 0.3 nm to 10 nm, such as from 0.6 nm to 5 nm. The two-dimensional charge carrier gas layer functions as a channel within a transistor 95 (e.g., a ferroelectric memory cell) of the first ferroelectric memory device 180.

A ferroelectric memory element 21 is located adjacent to, such as on a surface of, the semiconductor channel 40, i.e., on a surface of the two-dimensional charge carrier gas layer. The ferroelectric memory element 21 functions as a gate dielectric 20 within the transistor 95 of the first ferroelectric memory device 180. The ferroelectric memory element 21 is in contact with a first surface of the semiconductor channel 40. The ferroelectric memory element 21 includes, and/or consists essentially of, at least one ferroelectric material such as barium titanate (such as $BaTiO_3$; BT), colemanite (such as $Ca_2B_6O_{11}.5H_2O$), bismuth titanate (such as $Bi_{12}TiO_{20}$, $Bi_4Ti_3O_{12}$ or $Bi_2Ti_2O_7$), europium barium titanate, ferroelectric polymer, germanium telluride, langbeinite (such as $M_2M_2'(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as Pb (Zr,Ti) $O_3$; PZT), lithium niobate (such as $LiNbO_3$; LN), ($LaAlO_3$)), polyvinylidene fluoride $(CH_2CF_2)_n$, potassium niobate (such as $KNbO_3$), potassium sodium tartrate (such as $KNaC_4H_4O_6.4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$ (LT)), lead lanthanum titanate (such as $(Pb,La)TiO_3$ (PLT)), lead lanthanum zirconate titanate (such as $(Pb,La)(Zr,Ti)O_3$ (PLZT)), ammonium dihydrogen phosphate (such as $NH_4H_2PO_4$ (ADP)), or potassium dihydrogen phosphate (such as $KH_2PO_4$ (KDP)). In one embodiment, the ferroelectric memory element 21 comprises, and/or consists essentially of, a ferroelectric dielectric material.

A front side conductive gate electrode 51 is located directly on the ferroelectric memory element 21 on the opposite side of the semiconductor channel 40. The front side conductive gate electrode 51 functions as the gate electrode 50 of the transistor 95 of the first ferroelectric memory device 180. The conductive gate electrode 51 is in contact with the ferroelectric memory element 21. The conductive gate electrode 51 can include, and/or consist essentially of, a metallic material such as an elemental metal (Ti, Ta, or W), an intermetallic alloy of at least two elemental metals, a metal-semiconductor compound (such as a metal silicide), or a conductive metallic alloy of at least one elemental metal (such as Ti, Ta, W) and a nonmetallic element (such as nitrogen and/or oxygen, such as TiN or WN).

A source contact 42 contacts a first portion of the semiconductor channel 40 and a drain contact 44 contacts a second portion of the semiconductor channel. The ferroelectric memory element 21 is located between the source contact 42 and the drain contact 44. The source contact 42 and the drain contact 44 can comprise, and/or consist essentially of, a respective metallic contact material. The metallic contact material may be a metal-semiconductor compound, a conductive metallic nitride, an elemental metal, or an intermetallic alloy material. In one embodiment, a metallic material that can be used for the conductive gate electrode 51 can also be used for the source contact 42 and the drain contact 44.

In one embodiment, the two-dimensional charge carrier gas layer is located within 10 nm from a two-dimensional Euclidian plane that includes an interface between the semiconductor channel 40 and the ferroelectric memory element 21.

The transistor 95 of the first exemplary ferroelectric memory device 180 can be formed, for example, by forming the semiconductor channel 40 over a substrate 10, by forming the ferroelectric memory element 21 directly on the first surface of the semiconductor channel 40, by forming the conductive gate electrode 51 on the ferroelectric memory element 21, by forming the source contact 42 on the first portion of the semiconductor channel 40, and by forming the drain contact 44 on the second portion of the semiconductor channel 40. The substrate 10 has a planar top surface 11 that contacts a bottom surface of the semiconductor channel 40. In the embodiment shown in FIG. 7, the direction between the semiconductor channel 40 and the conductive gate electrode 51 is normal to the planar top surface 11 of the substrate 10. Alternatively, in the embodiment shown in FIG. 8, the transistor 95 may be rotated 90 degrees with respect to the transistor 95 shown in FIG. 7 such that the direction between the semiconductor channel 40 and the conductive gate electrode 51 is parallel to the plane of the planar top surface 11 of the substrate 10. The substrate 10 may comprise any suitable supporting substrate, such as a semiconductor wafer, an insulating substrate or a conductive substrate containing an insulating layer over its planar top surface 11.

During programming, a variable gate bias voltage $V_g$ can be applied to the conductive gate electrode 51 relative to the semiconductor channel 40 to program the polarization of the ferroelectric memory element 21. During sensing, a source-drain bias voltage is applied between (e.g., across) the source contact 42 and the drain contact 44 and by applying a gate sensing bias voltage to the conductive gate electrode 51. A sense circuitry 580 can measure the source-drain current while applying the source-drain bias voltage between (e.g., across) the source contact 42 and the drain contact 44.

Figure 8:
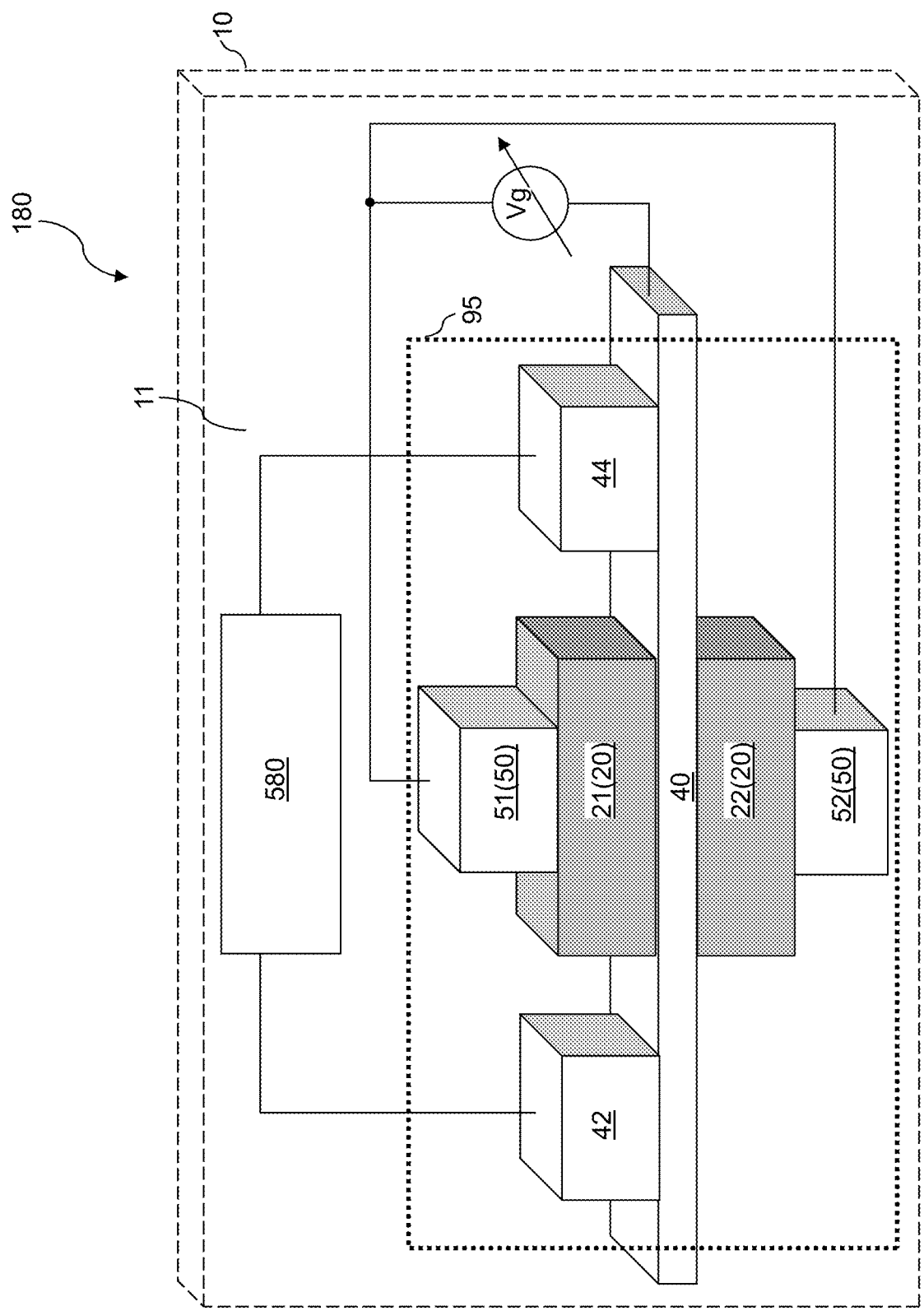
FIG. 8 is a second exemplary ferroelectric memory device according to a second embodiment of the present disclosure.

Referring to FIG. 8, a second exemplary ferroelectric memory device 180 according to a second embodiment of the present disclosure can be derived from the first exemplary ferroelectric memory device 180 of FIG. 7 by providing a backside ferroelectric memory element 22 in contact with a second surface of the semiconductor channel 40. The backside ferroelectric memory element 22 is an additional ferroelectric material portion that functions as an additional gate dielectric 20. The backside ferroelectric memory element 22 is located on a second surface of the semiconductor channel 40, which is parallel to the first surface of the semiconductor channel 40 and is located on the opposite side of the first surface of the semiconductor channel 40. The backside ferroelectric memory element 22 can have the same thickness as the ferroelectric memory element 21, and can include any ferroelectric material that can be employed for the ferroelectric memory element 21.

A conductive backside gate electrode 52 is provided on the backside ferroelectric memory element 22. The conductive backside gate electrode 52 can be in contact with the backside ferroelectric memory element 22. The conductive backside gate electrode 52 can include any material that can be employed for the conductive gate electrode 51. An electrically conductive path connecting the conductive backside gate electrode and the conductive gate electrode, thereby electrically shorting the conductive backside gate electrode 52 to the conductive gate electrode 51.

In one embodiment, the polarization of the ferroelectric memory element 21 and the polarization of the backside ferroelectric memory element 22 can point in opposite directions. Thus, the polarization of the ferroelectric memory element 21 and the polarization of the backside ferroelectric memory element 22 can point toward the semiconductor channel 40 in a first ferroelectric memory state, and the polarization of the ferroelectric memory element 21 and the polarization of the backside ferroelectric memory element 22 can point away from the semiconductor channel 40 in a second ferroelectric memory state. Thus, positive ferroelectric charges are present in the ferroelectric memory element 21 and the backside ferroelectric memory element 22 near the interfaces with the semiconductor channel 40 in the first ferroelectric memory state, which induces negative screening charges (mobile electrons) in the two-dimensional charge carrier gas layer near the interfaces with the ferroelectric memory element 21 and the backside ferroelectric memory element 22. Alternatively, if a semiconducting layer is used instead of a two-dimensional charge carrier gas layer, the induced charges will act to shift the Fermi energy and change the conductive state of the semiconducting layer. Likewise, negative ferroelectric charges are present in the ferroelectric memory element 21 and the backside ferroelectric memory element 22 near the interfaces with the semiconductor channel 40 in the second ferroelectric memory state, which induces positive screening charges (holes, i.e., absence of elections) in the two-dimensional charge carrier gas layer near the interfaces with the ferroelectric memory element 21 and the backside ferroelectric memory element 22. The second exemplary ferroelectric memory device 180 can be operated by applying the same voltage (e.g., the same polarity voltage pulses) to the conductive backside gate electrode 52 as the voltage applied to the front side conductive gate electrode 51.

The thickness of the semiconductor channel 40 in the second exemplary ferroelectric memory device 180 can be the same as the thickness of the semiconductor channel in the first exemplary ferroelectric memory device 180. Alternatively, the thickness of the semiconductor channel 40 in the second exemplary ferroelectric memory device 180 can be in a range from 1.0 times the thickness of the semiconductor channel 40 in the first exemplary ferroelectric memory device 180 to 2.0 times the thickness of the semiconductor channel in the first exemplary ferroelectric memory device 180. The increased thickness window for the semiconductor channel 40 in the second exemplary ferroelectric memory device 180 is due to the dual gate configuration in which the screening charges are induced from two different ferroelectric polarizations in an additive manner.

The transistor 95 of the second exemplary ferroelectric memory device 180 can be formed by modifying the method for forming the transistor 95 of the first exemplary ferroelectric memory device 180. In addition to the processing steps employed to form the various components of the first exemplary ferroelectric memory device 180, the backside ferroelectric memory element 22 can be formed on the second surface of the semiconductor channel 40, and the conductive backside gate electrode 52 can be formed on the backside ferroelectric memory element 22.

In one embodiment, the transistor 95 of the second exemplary ferroelectric memory device 180 may be supported by the substrate 10 having the planar top surface 11 that is perpendicular to the plane of the interface between the semiconductor channel 40 and the ferroelectric memory element 21 and is parallel to the direction of the electrical current in the semiconductor channel 40 during a sensing operation, i.e., the direction between the source contact 42 and the drain contact 44.

Alternatively, the transistor 95 shown in FIG. 8 may be rotated by 90 degrees to have configuration similar to that shown in FIG. 7. In this alternative configuration, the conductive backside gate electrode 52 is formed over the substrate 10, the backside ferroelectric memory element 22 is formed over the conductive backside gate electrode 52, the semiconductor channel 40 is formed over the backside ferroelectric memory element 22, the ferroelectric memory element 21, the source contact 42 and the drain contact 44 are formed over the semiconductor channel 40, and the front side conductive gate electrode 51 is formed over the ferroelectric memory element 21.

Figure 9:
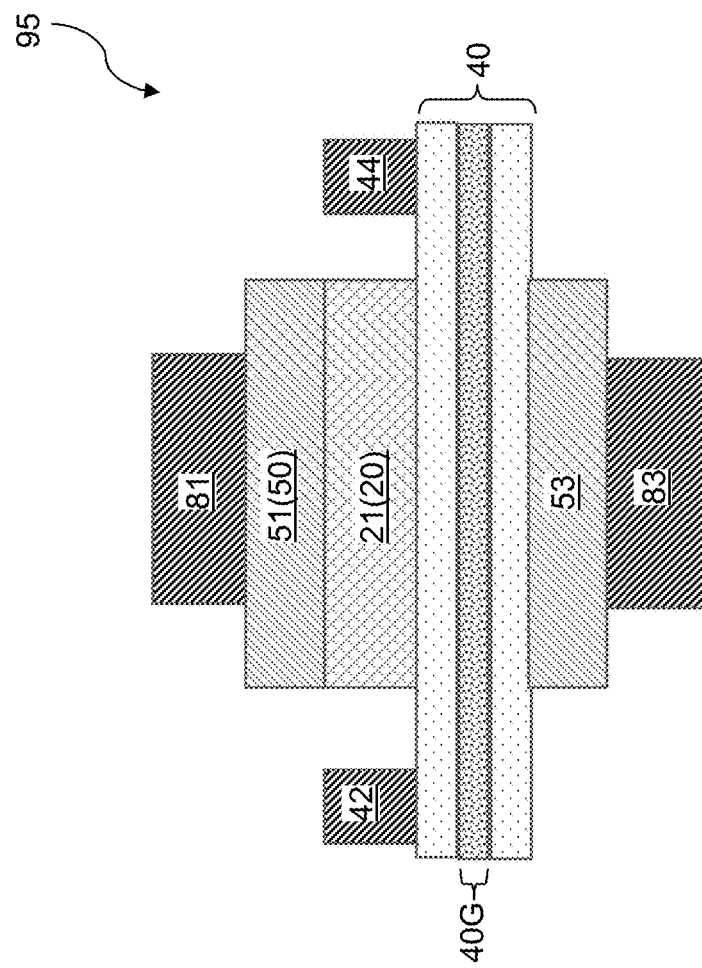
FIG. 9 is a third exemplary ferroelectric memory device according to a third embodiment of the present disclosure.

Referring to FIG. 9, a transistor 95 of a third exemplary ferroelectric memory device according to an embodiment of the present disclosure is illustrated, which can be derived from the first exemplary ferroelectric memory device 180 by forming a backside contact electrode 53 directly on the second surface of the semiconductor channel 40. A two-dimensional semiconductor material layer 40G within the semiconductor channel 40 is expressly illustrated. A described above, the two-dimensional semiconductor material layer 40G may comprise the entire semiconductor channel 40 or just a portion of the semiconductor channel 40. The two-dimensional semiconductor material layer 40G can have a band gap of at least 1.1 eV, can include a thickness of 1 to 5 monolayers of the atoms of the semiconductor material and/or can include a two-dimensional charge carrier gas layer. The second surface of the semiconductor channel 40 is located on the opposite side of the first surface of the semiconductor channel 40. Thus, the backside contact electrode 53 can be in contact with the second surface of the semiconductor channel 40. The backside contact electrode 53 can apply a backside bias voltage to the semiconductor channel 40 during programming of the ferroelectric polarization of the ferroelectric memory element 21. Optionally, a front gate contact 81 and/or a back gate contact 83 may be formed on the conductive gate electrode 51 and on the backside contact electrode 53, respectively, to facilitate application of bias voltages that are employed during operation of the transistor 95 of the third exemplary ferroelectric memory device. In an alternative embodiment, layers 51 and/or 53 illustrated in FIG. 9 may comprise gate insulating layers and contacts 81 and/or 83 may comprise the front side conductive gate electrode and the backside contact electrode (e.g., a back gate), respectively.

Figure 10A:
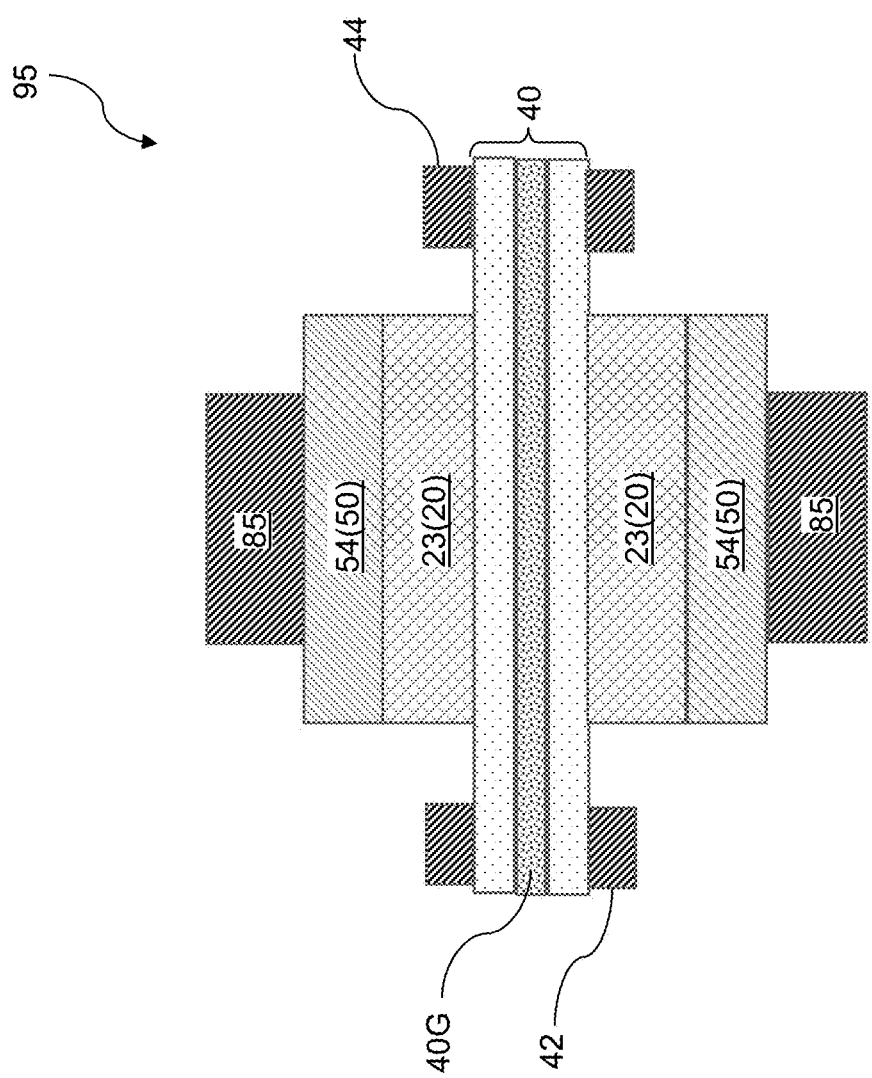
FIG. 10A is vertical cross-sectional view of a fourth exemplary ferroelectric memory device according to a fourth embodiment of the present disclosure.
Figure 10B:
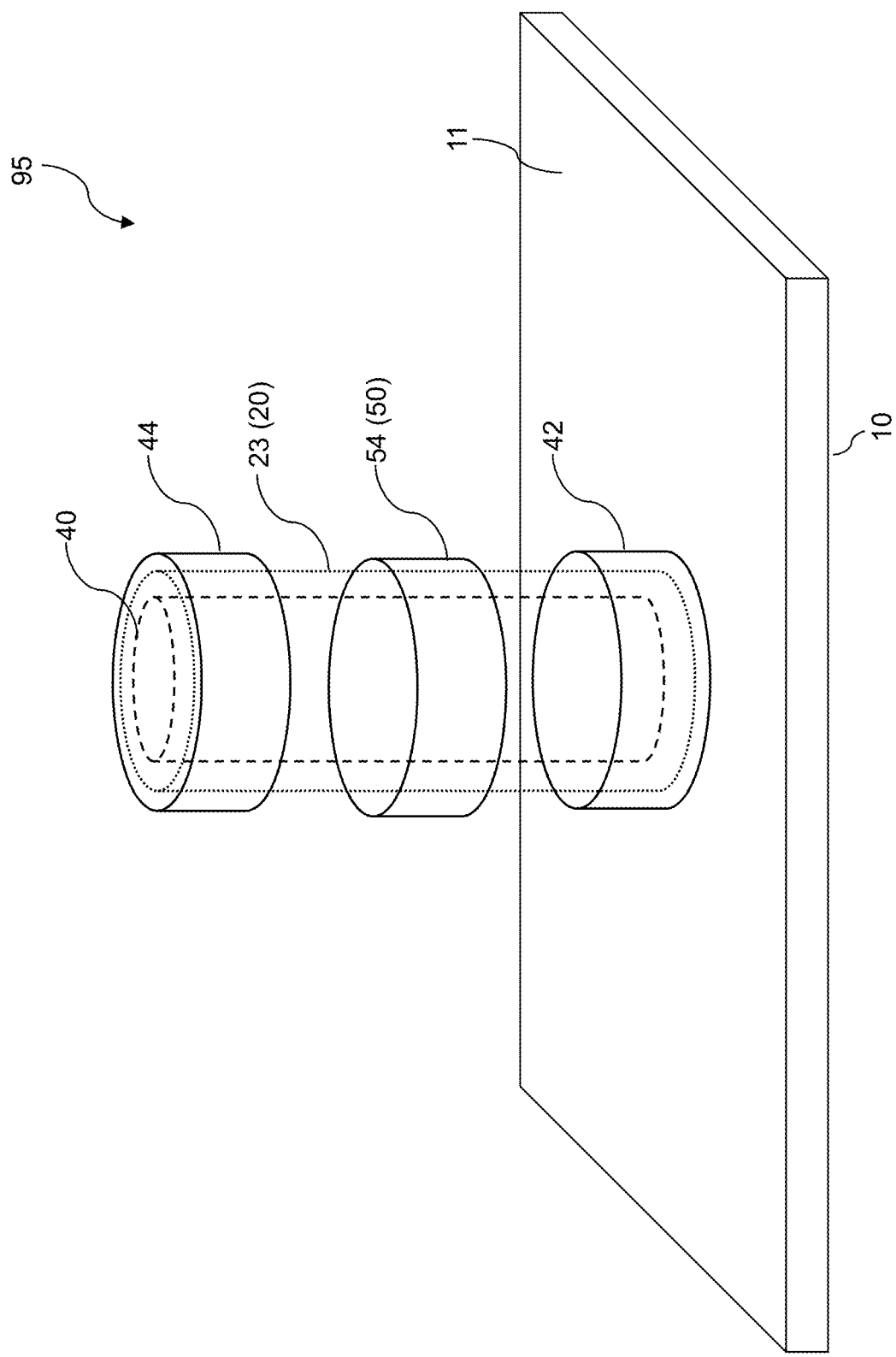
FIG. 10B is schematic see-through perspective view of the fourth exemplary ferroelectric memory device of FIG. 10A.

Referring to FIGS. 10A and 10B, a transistor 95 of a fourth exemplary ferroelectric memory device according to a fourth embodiment of the present disclosure is illustrated. In the transistor 95 of the fourth exemplary ferroelectric memory device, the ferroelectric memory element 20 and/or the gate electrode 50 can have a tubular configuration which surrounds the semiconductor channel 40. In other words, the gate electrode 50 may be a wrap gate electrode 54 which wraps around the ferroelectric memory element 20 which may be a wrap around ferroelectric memory element 23. The wrap around ferroelectric memory element 23 wraps around (i.e., surrounds) the semiconductor channel 40.

In this embodiment, the semiconductor channel 40 may be a vertical pillar or a vertical shell which surrounds a vertical pillar which extends lengthwise perpendicular to the planar top surface 11 of the substrate 10, as shown in FIG. 10B. The wrap around ferroelectric memory element 23 may be an inner shell which wraps around (i.e., surrounds) the semiconductor channel 40. The wrap gate electrode 54 wraps around the middle portion of the wrap around ferroelectric memory element 23. The source and drain contacts (42, 44) contact opposite ends of the semiconductor channel 40 on opposite sides of the wrap gate electrode 54. The source and drain contacts (42, 44) may also wrap around the semiconductor channel 40 or they may contact only a portion of the outer perimeter of the semiconductor channel 40.

Generally, the various ferroelectric memory devices 180 of the embodiments of the present disclosure can be operated by programming a polarization direction of the ferroelectric memory element 21 by applying a positive bias voltage or a negative bias voltage to the conductive gate electrode 51 with respective to the semiconductor channel 40, and by sensing the polarization direction of the ferroelectric memory element 21 by measuring a magnitude of electrical current between the source contact 42 and the drain contact 44 while applying a read voltage (i.e., a measurement bias voltage) between the source contact 42 and the drain contact 44. If a backside ferroelectric memory element 22 is included, then the ferroelectric polarization direction of the backside ferroelectric memory element 22 is opposite of the ferroelectric polarization direction of the ferroelectric memory element 21. The thickness and/or the material composition of the backside ferroelectric memory element 22 may be the same as, or may be different from, the thickness and/or the material composition of the ferroelectric memory element 21. In other words, the polarization of the ferroelectric memory element 21 and the backside ferroelectric memory element 22 are antiparallel to each other, and are flipped simultaneously during programming If a conductive backside gate electrode 52 is included, then the voltage applied to the conductive backside gate electrode 52 can be the same as the voltage applied to the front side conductive gate electrode 51. A read voltage can be applied to the conductive gate electrode 51 while sensing the polarization direction of the ferroelectric memory element 21 and optionally sensing the polarization direction of the ferroelectric backside memory element 22.

The device of the embodiments of the present disclosure provides advantages over ferroelectric—pristine graphene memory elements based on tunneling electroresistance (TER) which have poor polarization retention and which require thick ferroelectric barriers to stabilize polarization. However the thick barriers lead to low tunneling currents and therefore strongly reduce the signal (e.g., reading current) in TER-based devices. In contrast, reading current does not flow through the ferroelectric material in devices of the embodiments of the present disclosure. Thus, a much thicker ferroelectric layer can be used in the device of the embodiments of the present disclosure compared to prior art TER-based devices without reducing the reading current, and the problem of polarization retention is reduced or overcome in the devices of the embodiments of the present disclosure.

Without wishing to be bound by a particular theory and in order to demonstrate advantages of the device of the embodiments of the present disclosure, the inventors calculated a ferroelectric polarization controlled on-off ratio on the semiconductor's band gap in finite size nanostructures at room temperature. The inventors developed quantum mechanical calculations of electrical conductivity based on the ballistic electron transport through finite size semiconductor attached to ferroelectric material and two metallic contacts. The inventors' calculations are based on the Green Function formalism within a two-band tight binding Hamiltonian model. In contrast, first principles electronic structure calculations were used to obtain the density of states and band gaps of two-dimensional semiconductor materials.

Specifically, the structure of FIG. 1 was modeled with a rectangular device size of 10 nm×5 nm (i.e., the area of each interface between adjacent layers). The thickness d of the ferroelectric material portion was 5 nm, and the distance between the ferroelectric material portion and each metallic contact was 1 nm. The electrostatic potential in the semiconductor material portion underneath the ferroelectric material portion was controlled by reversing ferroelectric polarization.

The results of the inventors' simulations are illustrated in FIGS. 11, 12, and 13A-13D. The accuracy of the conductivity simulations was limited by the numerical precision. The values of conductivity below $10^{-2}$ (Ohm·m)$_{-1}$ are outside the range of reliable numerical accuracy, and therefore, the calculations were limited to the range of ferroelectric polarization leading to conductivity values of at least $10^{-2}$ (Ohm·m)$^{-1}$.

Figure 11:
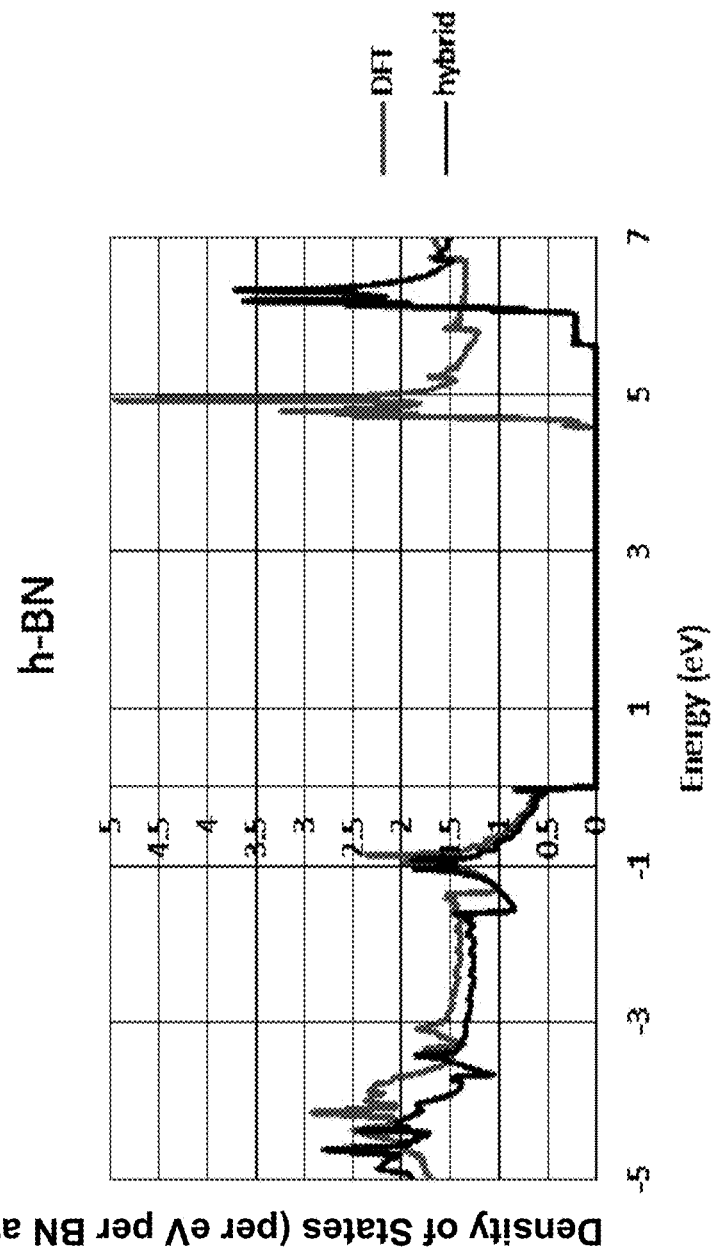
FIG. 11 illustrates calculated density of states per eV per atom for hexagonal boron nitride according to the density function theory (DFT) and the hybrid functional.

Referring to FIG. 11, calculated density of states per eV per atom is shown for hexagonal boron nitride. This calculation was based on the density function theory (DFT) and the hybrid functional.

Figure 12:
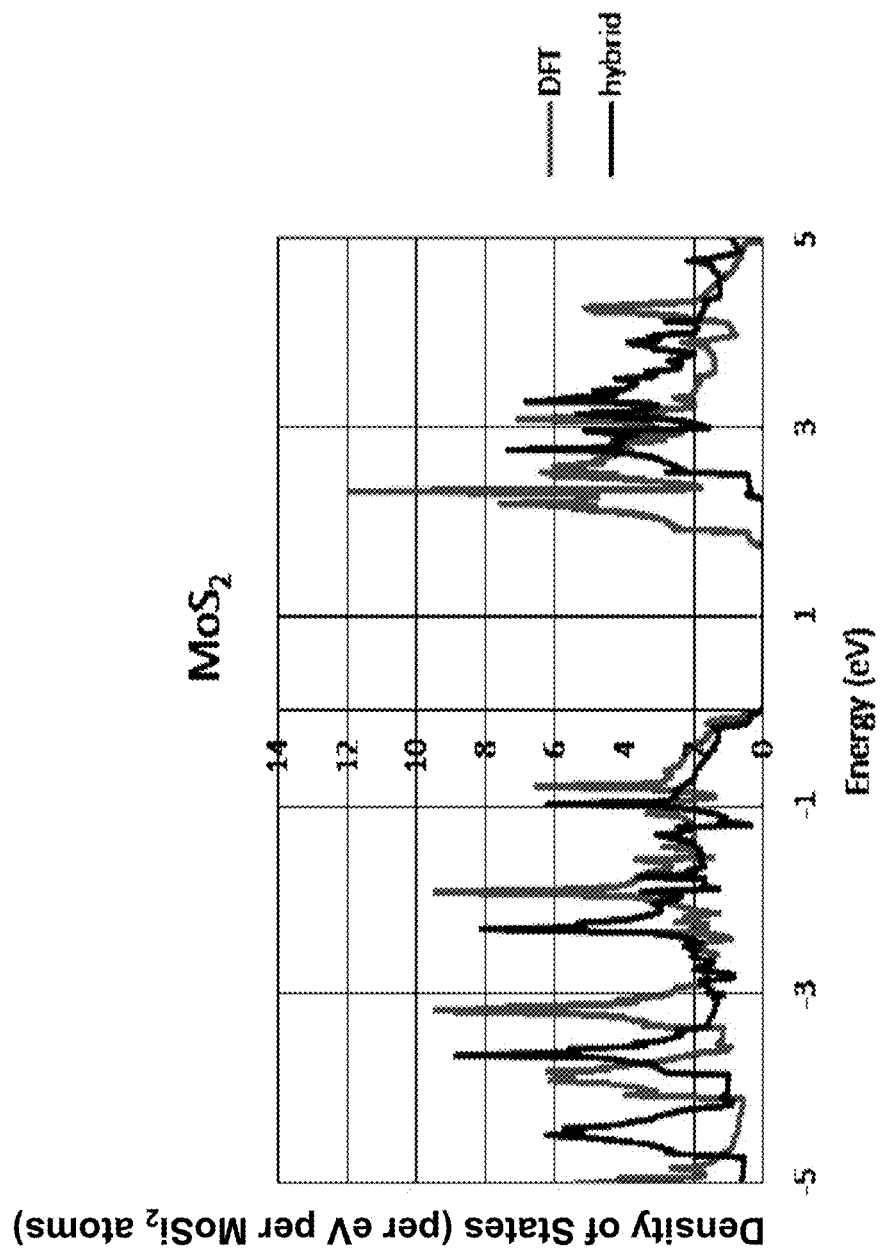
FIG. 12 illustrates calculated density of states per eV per atom for molybdenum disulfide according to the density function theory (DFT) and the hybrid functional.

Referring to FIG. 12, calculated density of states per eV per atom is shown for molybdenum disulfide. This calculation was based on the density function theory (DFT) and the hybrid functional.

Figure 13A:
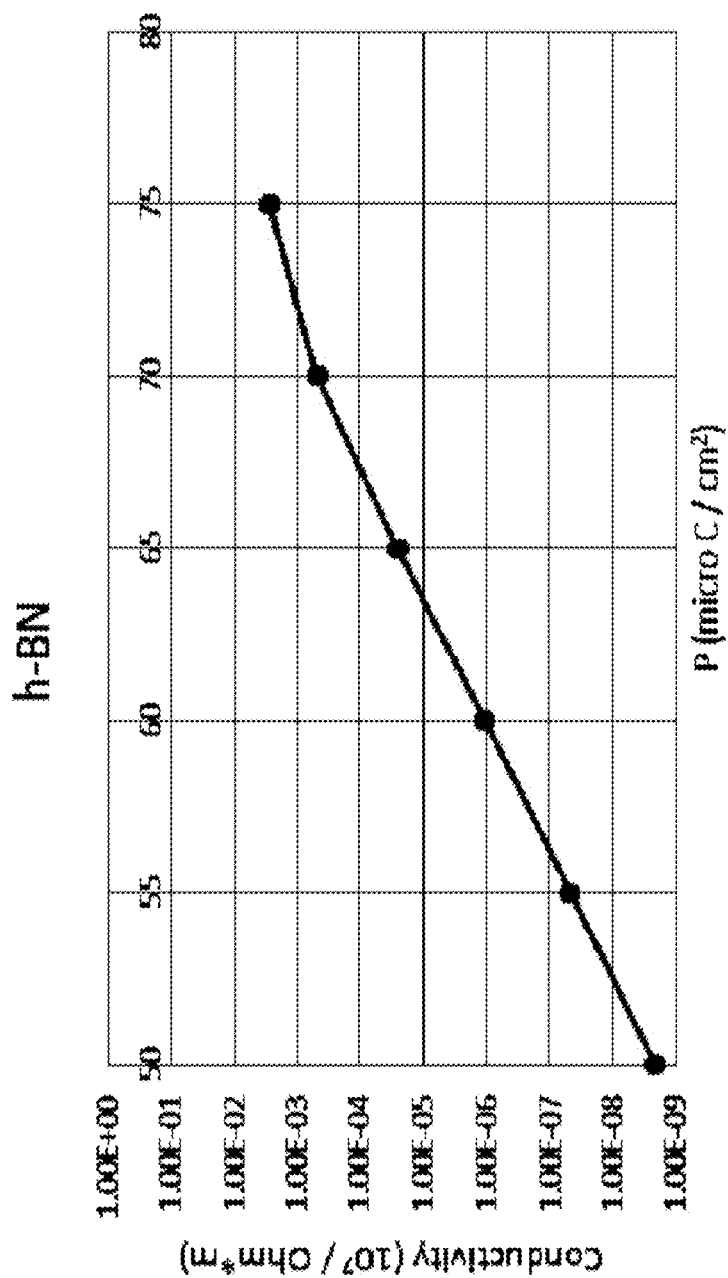
FIG. 13A is a graph of electrical conductivity for hexagonal boron nitride as a function of polarization calculated within the tight binding model.
Figure 13B:
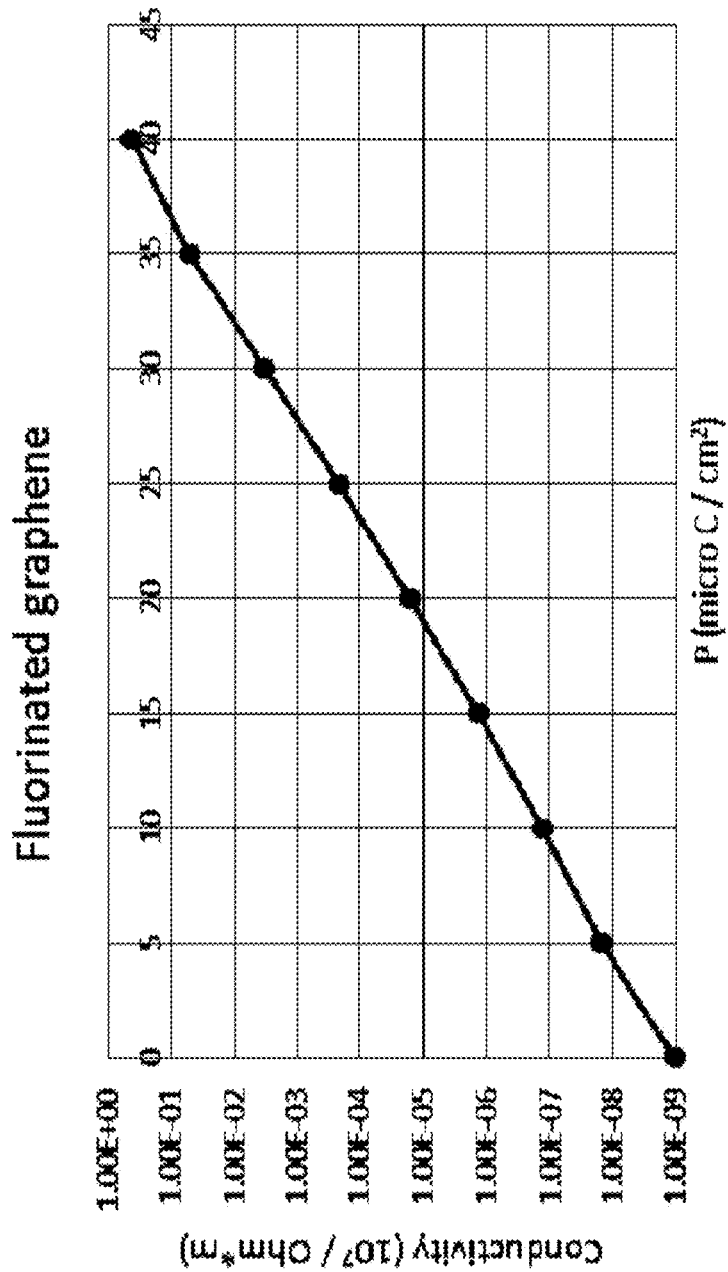
FIG. 13B is a graph of electrical conductivity for fluorinated graphene as a function of polarization calculated within the tight binding model.
Figure 13C:
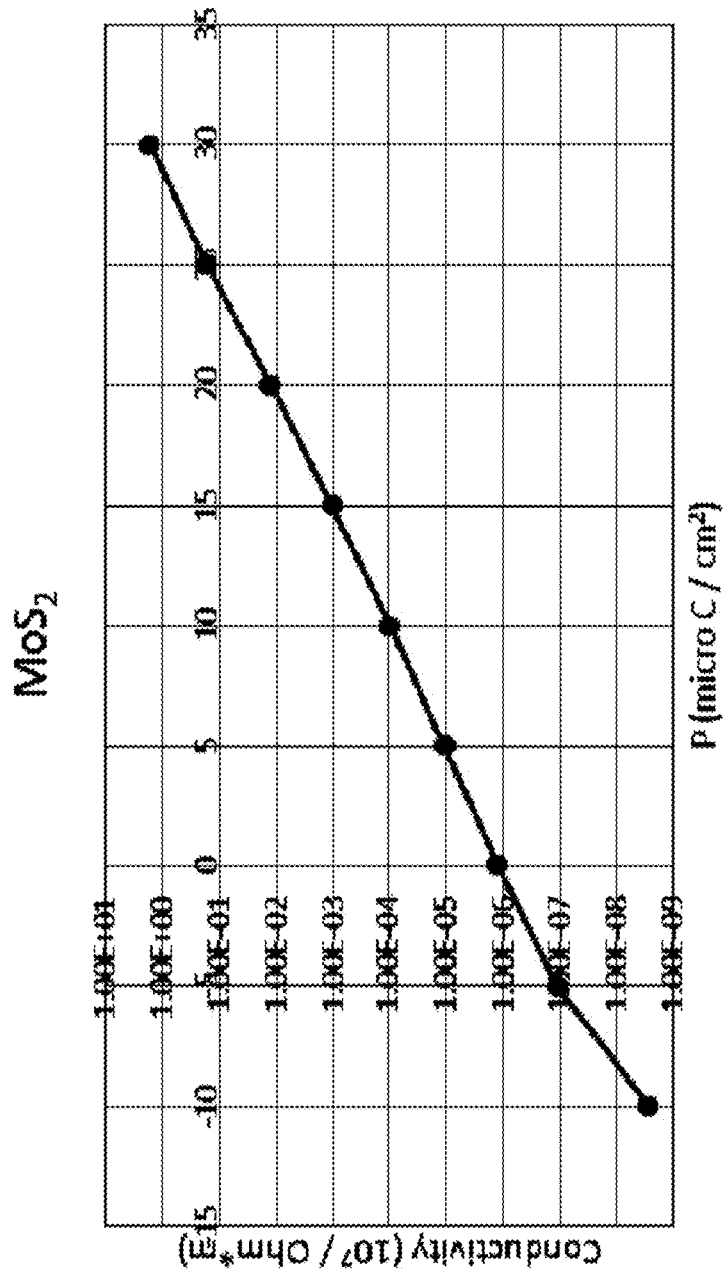
FIG. 13C is a graph of electrical conductivity for molybdenum disulfide as a function of polarization calculated within the tight binding model.
Figure 13D:
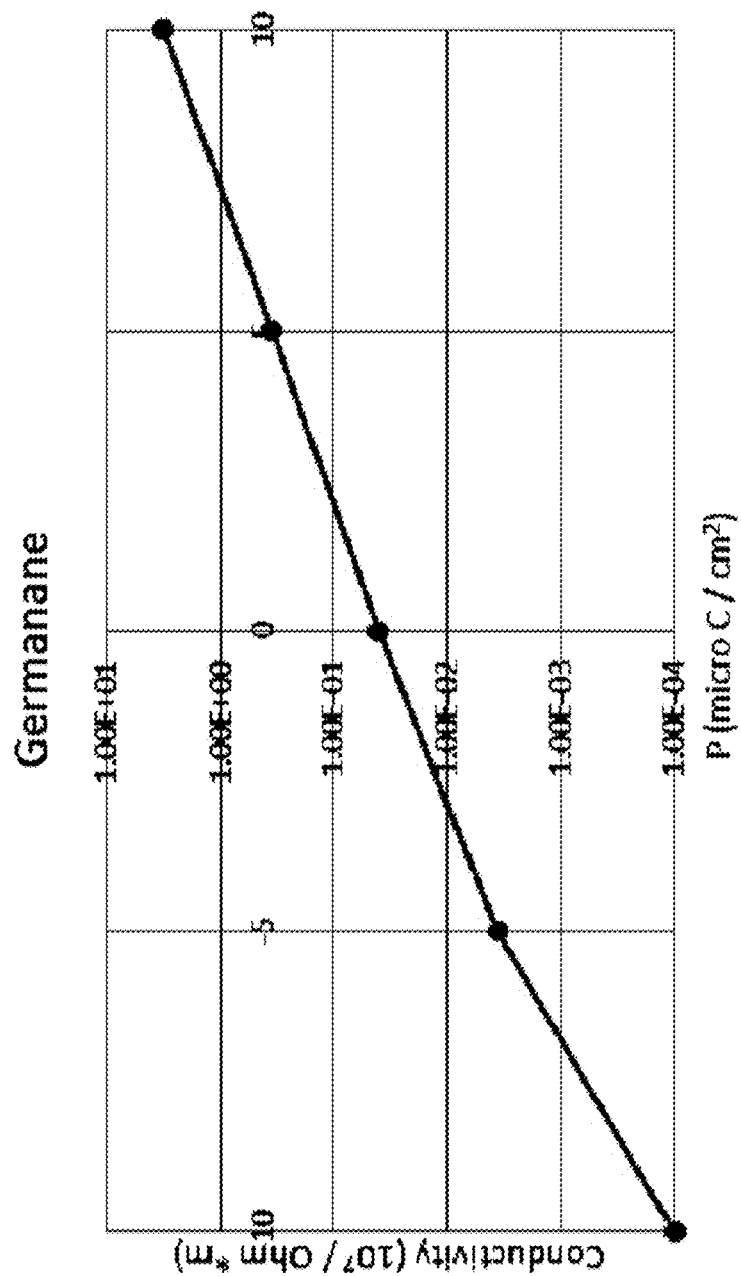
FIG. 13D is a graph of electrical conductivity for germanane as a function of polarization calculated within the tight binding model.

FIGS. 13A-13D show graphs for the calculated electrical conductivity (in units of $10^7$/Ohm·m) for the transistor 95 of the ferroelectric memory device 180 of the embodiments of the present disclosure at room temperature (20 degrees Celsius) as a function of ferroelectric polarization. FIG. 13A shows the calculated electrical conductivity for the case in which the ferroelectric memory element consists of hexagonal boron nitride. FIG. 13B shows the calculated electrical conductivity for the case in which the ferroelectric memory element consists of fluorinated graphene. FIG. 13C shows the calculated electrical conductivity for the case in which the ferroelectric memory element consists of molybdenum disilicide. FIG. 13D shows the calculated electrical conductivity for the case in which the ferroelectric memory element consists of germanane.

FIGS. 13A-13D show that conductivities of all semiconductor channels of the embodiments of the present disclosure exponentially increases (or decreases) with ferroelectric polarization for positive (or negative) direction of ferroelectric polarization. This allows fitting the calculated conductivity σ(P) to a fitting function including the ferroelectric polarization P as a variable. Further, the on-off ratio ON/OFF (i.e., the ratio of the conductivity in the on state to the conductivity in the off state) can be fitted to another fitting function having another variable $P_{max}$, which is the maximum value of ferroelectric polarization required to push the Fermi level of a two-dimensional semiconductor into the conduction band. The functional forms for σ(P) and ON/OFF are given by:

$$\sigma(P) = \sigma_0 e^{aP}, \text{ and}$$

$$ON/OFF = e^{2aP_{max}},$$

in which where $\sigma_0 = \sigma(P=0)$ is the conductivity of a semiconductor channel for the paraelectric case.

Table 3 tabulates best fit values for the fitting parameters for σ(P) and ON/OFF.

TABLE 3 fitting parameters for ferroelectric materials

| Ferroelectric material | Optimum value for a (in cm$^2$/μC) | $P_{max}$ (in μC/cm$^2$) |
|---|---|---|
| Hexagonal BN | 0.61 | 75 |
| MoSi$_2$ | 0.49 | 30 |
| Fluorinated graphene | 0.50 | 40 |
| germanane | 0.44 | 10 |

While defect states may limit the value for the ON/OFF ratio in practice, the various two-dimensional semiconductor materials provide generally high ON/OFF ratio. The simulations show that higher ON/OFF ratios are possible with wider band gaps two-dimensional semiconductor materials and a thicker ferroelectric material can be used in conjunction with such two-dimensional semiconductor materials. A higher operating voltage is expected with an increase in the thickness of the ferroelectric material in the ferroelectric memory device 180 of the embodiments of the resent disclosure.

Figure 14:
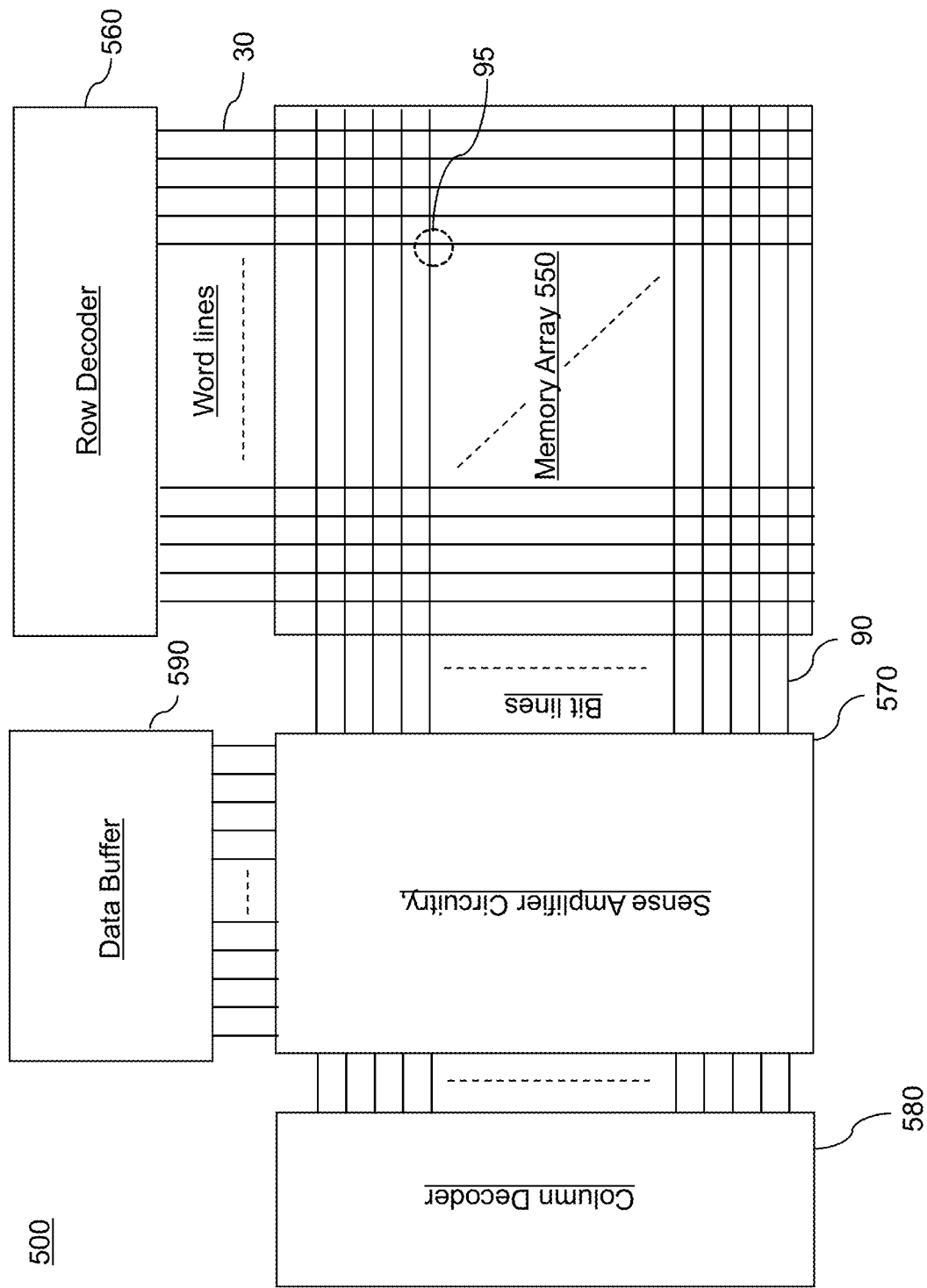
FIG. 14 is a schematic diagram of a ferroelectric memory device according to an embodiment of the present disclosure.

According to an aspect of the present disclosure, a ferroelectric memory array can include an array of memory cells (e.g., transistors) 95 of the embodiments of the present disclosure. Referring to FIG. 14, a schematic diagram is shown for a ferroelectric memory array including the transistors 95 in an array configuration. The ferroelectric memory array can be configured as a random access memory device 500. As used herein, a "random access memory device" refers to a memory device including memory cells that allow random access, i.e., access to any selected memory cell upon a command for reading the contents of the selected memory cell.

The random access memory device 500 of the present disclosure includes a memory array region 550 containing an array of the respective ferroelectric memory cells 180 located at the intersection of the respective word lines (which may be comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). For example, the word lines 30 may be electrically connected to and/or may comprise the gate electrodes 50 of the transistors 95 in the array, while the bit lines 90 may be electrically connected to and/or may comprise the source or drain contacts (42, 44) of the transistors 95 in the array.

The random access memory device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the ferroelectric memory cells (e.g., ferroelectric memory transistors) 95 are provided in an array configuration that forms the random access memory device 500. As such, each of the ferroelectric memory cells 95 can be a two-terminal device including a respective first electrode and a respective second electrode. It should be noted that the location and interconnection of elements are schematic and the elements may be arranged in a different configuration. Further, a ferroelectric memory cell 95 may be manufactured as a discrete device, i.e., a single isolated device.

The embodiments of the present disclosure provide a nonvolatile memory element based on ferroelectric-controlled electrical conductivity of a two-dimensional semiconductor material, or a two-dimensional charge carrier gas layer, such as a 2DEG layer 40G. Information can be written and stored by applying electric pulses that reverse the ferroelectric polarization and thereby induce surface charges in the semiconductor or in the two-dimensional charge carrier gas layer. Information can be read by measuring the resistance of a semiconductor channel including the two-dimensional charge carrier gas layer.

The device of the embodiments of the present disclosure provides significant increase in the difference in electrical resistance of two-dimensional semiconductor material layer compared to previously known three-terminal ferroelectric-graphene structures by replacing gapless pristine graphene (i.e., a band gap of zero) with two-dimensional semiconductor material layer, which can have a band gap of at least 1.1 eV. The device of the embodiments of the present disclosure can strongly improve the stability of ferroelectric polarization compared to previously known two-terminal perpendicular tunnel junction devices because the thickness of a ferroelectric material portion can be increased without signal loss. The device of the embodiments present disclosure is a non-volatile memory device enabling non-volatile storage of information, which is not provided by high-electron-mobility transistors (HEMTs) or heterojunction field effect transistors (HFETs) known in the art. The device of the embodiments of the present disclosure enables low power sensing because the in-plane geometry allows low-current operation during the sensing step.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A ferroelectric memory device comprising:
   a two-dimensional semiconductor material layer having a band gap of at least 1.1 eV and at least one of a thickness of 1 to 5 monolayers of atoms of the semiconductor material or includes a two-dimensional charge carrier gas layer;
   a source contact contacting a first portion of the two-dimensional semiconductor material layer;
   a drain contact contacting a second portion of the two-dimensional semiconductor material layer;
   a ferroelectric memory element located between the source and drain contacts and adjacent to a first surface of the two-dimensional semiconductor material layer; and
   a conductive gate electrode located adjacent to the ferroelectric memory element.

2. The ferroelectric memory device of claim 1, wherein:
   the two-dimensional semiconductor material layer includes the two-dimensional charge carrier gas layer which comprises a two-dimensional electron gas (2DEG) layer;
   the ferroelectric memory element contacts the first surface of the two-dimensional semiconductor material layer; and
   the conductive gate electrode contacts the ferroelectric memory element.

3. The ferroelectric memory device of claim 2, wherein the ferroelectric memory element comprises a ferroelectric dielectric material.

4. The ferroelectric memory device of claim 2, wherein the ferroelectric dielectric material is selected from barium titanate, colemanite, bismuth titanate, europium barium titanate, ferroelectric polymer, germanium telluride, langbeinite, lead scandium tantalate, lead titanate, lead zirconate titanate, lithium niobate, polyvinylidene fluoride, potassium niobate, potassium sodium tartrate, potassium titanyl phosphate, sodium bismuth titanate, ammonium dihydrogen phosphate, potassium dihydrogen phosphate KH$_2$PO$_4$ (KDP), lithium tantalate, lead lanthanum titanate, and lead lanthanum zirconate titanate.

5. The ferroelectric memory device of claim 2, further comprising:
- a backside ferroelectric memory element in contact with a second surface of the two-dimensional semiconductor material layer that is located on an opposite side of the first surface of the two-dimensional semiconductor material layer;
- a conductive backside gate electrode in contact with the backside ferroelectric memory element; and
- an electrically conductive path connecting the conductive backside gate electrode and the conductive gate electrode.

6. The ferroelectric memory device of claim 2, further comprising a backside contact electrode located adjacent to a second surface of the two-dimensional semiconductor material layer that is located on an opposite side of the first surface of the two-dimensional semiconductor material layer.

7. The ferroelectric memory device of claim 1, wherein:
- the two-dimensional semiconductor material layer has a thickness in a range from 0.3 nm to 10 nm; and
- the two-dimensional semiconductor material layer comprises a two-dimensional charge carrier gas layer that is located within 10 nm from a two-dimensional Euclidian plane that includes an interface between the two-dimensional semiconductor material layer and the ferroelectric memory element.

8. The ferroelectric memory device of claim 1, wherein the two-dimensional semiconductor material layer has the thickness of 1 to 5 monolayers of atoms of the semiconductor material.

9. The ferroelectric memory device of claim 1, wherein each of the conductive gate electrode, the source contact, and the drain contact comprise a respective metallic contact material selected from a metal-semiconductor compound, a conductive metallic nitride, an elemental metal, and an intermetallic alloy material.

10. The ferroelectric memory device of claim 1, wherein the two-dimensional semiconductor material layer comprises fluorinated graphene.

11. The ferroelectric memory device of claim 1, wherein the two-dimensional semiconductor material layer comprises hexagonal boron nitride.

12. The ferroelectric memory device of claim 1, wherein the two-dimensional semiconductor material layer comprises molybdenum disulfide.

13. The ferroelectric memory device of claim 1, wherein the two-dimensional semiconductor material layer comprises germanane.

14. A ferroelectric memory array comprising an array of the ferroelectric memory devices of claim 1.

15. A method of operating the ferroelectric memory device of claim 1, comprising:
- programming a polarization direction of the ferroelectric memory element by applying a positive bias voltage or a negative bias voltage to the conductive gate electrode with respective to the two-dimensional semiconductor material layer; and
- sensing a polarization direction of the ferroelectric memory element by measuring a magnitude of electrical current between the source contact and the drain contact under a read voltage between the source contact and the drain contact.

16. The method of claim 15, further comprising applying a gate read voltage to the conductive gate electrode while sensing the polarization direction of the ferroelectric memory element.

17. The method of claim 15, wherein the ferroelectric memory device further comprises:
- a backside ferroelectric memory element in contact with a second surface of the two-dimensional semiconductor material layer that is located on an opposite side of the first surface of the two-dimensional semiconductor material layer; and
- a conductive backside gate electrode in contact with the backside ferroelectric memory element.

18. The method of claim 17, further comprising applying a same bias voltage to the conductive backside gate electrode as to the conductive gate electrode during programming and sensing the polarization direction of the ferroelectric memory element.

19. A method of manufacturing the ferroelectric memory device of claim 1, comprising:
- forming the two-dimensional semiconductor material layer;
- forming the ferroelectric memory element directly on the first surface of the two-dimensional semiconductor material layer;
- forming the conductive gate electrode on the ferroelectric memory element;
- forming the source contact on the first portion of the two-dimensional semiconductor material layer; and
- forming the drain contact on the second portion of the two-dimensional semiconductor material layer.

20. The method of claim 19, further comprising:
- forming a backside ferroelectric memory element on a second surface of the two-dimensional semiconductor material layer; and
- forming a conductive backside gate electrode on the backside ferroelectric memory element.

* * * * *